(12) United States Patent
Stern et al.

(10) Patent No.: US 6,393,224 B1
(45) Date of Patent: May 21, 2002

(54) E-FILM CARTRIDGE WITH SENSOR AVOIDANCE FEATURE

(75) Inventors: Jonathan Michael Stern, Newport Beach; Itzhak Sapir, Irvine; Randy Carlson, Costa Mesa, all of CA (US)

(73) Assignee: Silicon Film Technologies, Inc., Irvine, CA (US)

( * ) Notice: Subject to any disclaimer, the term of this patent is extended or adjusted under 35 U.S.C. 154(b) by 0 days.

(21) Appl. No.: 09/616,434

(22) Filed: Jul. 14, 2000

Related U.S. Application Data

(60) Provisional application No. 60/144,433, filed on Jul. 16, 1999, and provisional application No. 60/147,580, filed on Aug. 6, 1999.

(51) Int. Cl.⁷ .............................................. G03B 17/02
(52) U.S. Cl. ....................................... 396/429; 348/64
(58) Field of Search .............................. 396/429, 207, 396/538; 348/64

(56) References Cited

U.S. PATENT DOCUMENTS

| | | | | |
|---|---|---|---|---|
| 5,452,000 A | * | 9/1995 | Sapir | ........................... 348/64 |
| 5,561,458 A | * | 10/1996 | Cronin et al. | .................. 348/64 |
| 5,870,638 A | * | 2/1999 | Kurosawa | .................... 396/429 |
| 6,278,481 B1 | * | 8/2001 | Schmidt | ....................... 348/64 |

FOREIGN PATENT DOCUMENTS

| | | |
|---|---|---|
| EP | 0 825 766 | 2/1998 |
| JP | 01/279243 | 11/1989 |
| WO | WO 99/12345 | 3/1999 |

OTHER PUBLICATIONS

PCT International Search Notification and Report, dated Oct. 26, 2000.

* cited by examiner

*Primary Examiner*—David M. Gray
(74) *Attorney, Agent, or Firm*—Knobbe, Martens, Olson & Bear, LLP

(57) ABSTRACT

An electronic film cartridge includes a can section that defines an outer contour and is used to hold electronic components, and an imager assembly. The outer contour is configured so as to not completely depress at least one sensor mounted to the film compartment of a photographic camera into which the film cartridge is to be inserted. The electronic film cartridge is also configured to fit within different cameras with different dimensions between the film can area and the aperture.

26 Claims, 19 Drawing Sheets

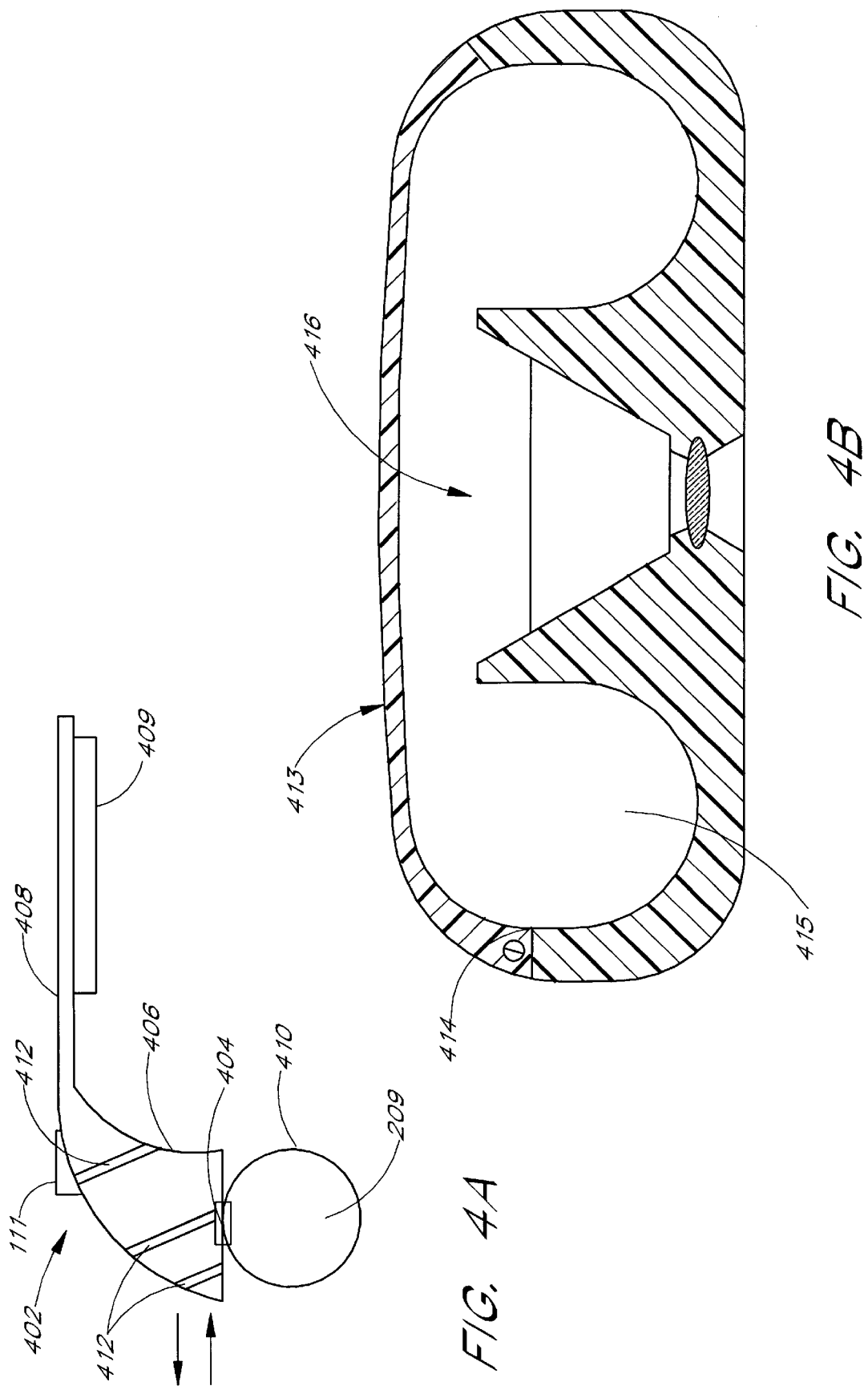

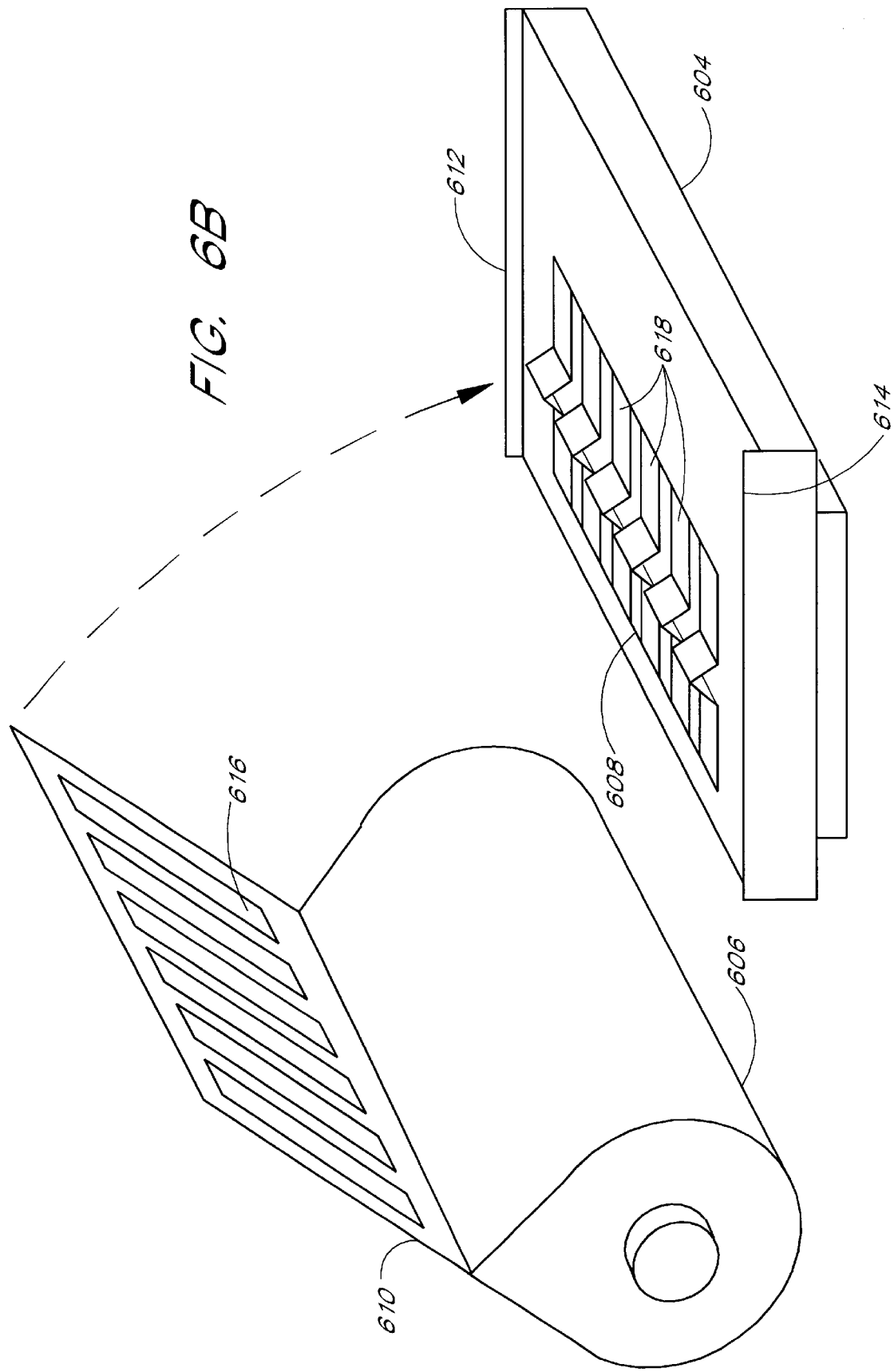

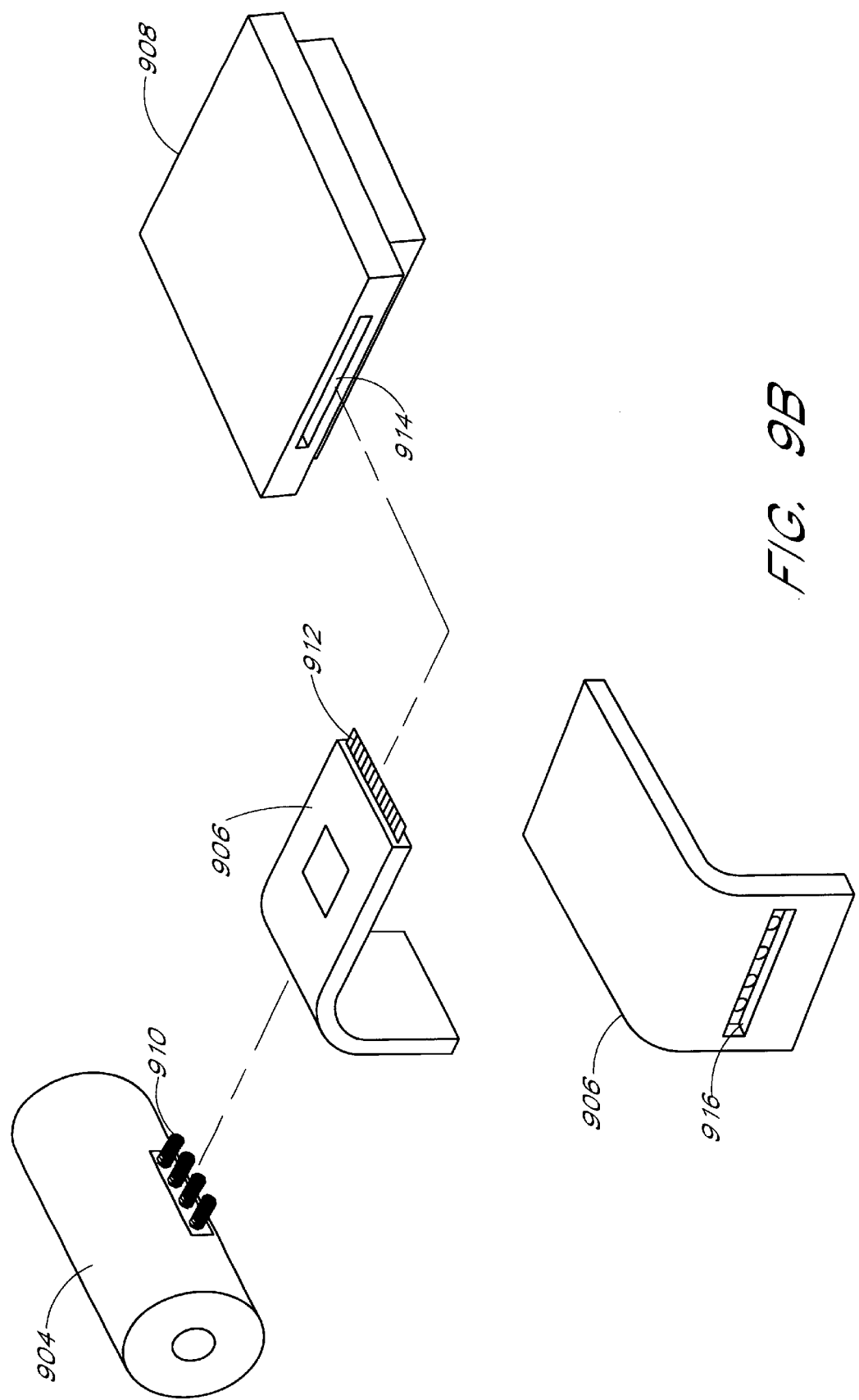

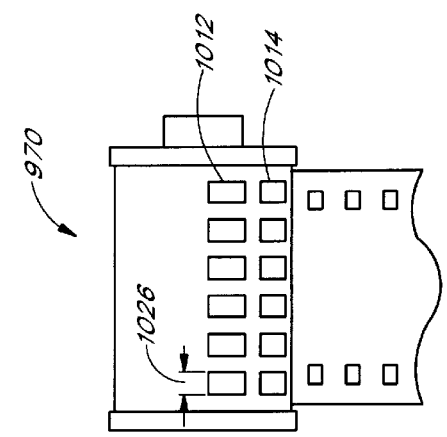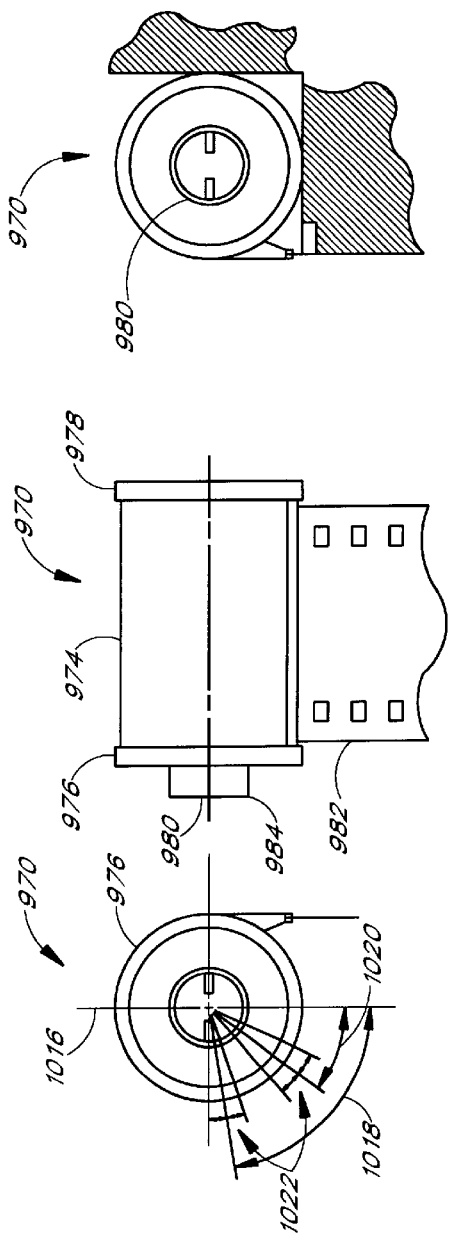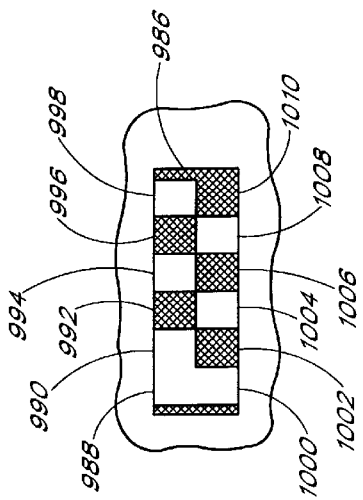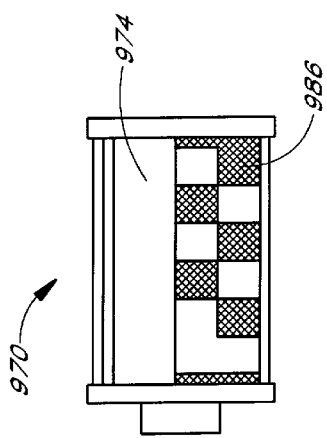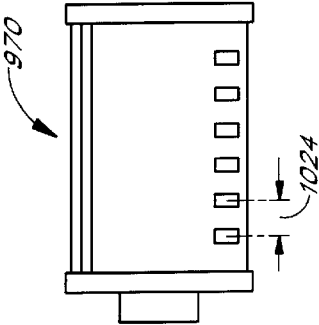

E-FILM CARTRIDGE WITH SENSOR AVOIDANCE FEATURE

PRIORITY INFORMATION

This application is based on and claims priority to U.S. Provisional Application No. 60/144,433, filed Jul. 16, 1999, and U.S. Provisional Application No. 60/147,580 filed Aug. 6, 1999, the entire contents of both being hereby expressly incorporated by reference.

BACKGROUND OF THE INVENTION

1. Field of the Invention

The present invention relates to the field of photographic cameras. Particularly, the present invention relates to the field of removable electronic imaging modules for converting conventional cameras to electronic imaging cameras.

2. Description of the Prior Art

Conventional photographic cameras record images by sequentially projecting optical images onto a roll of film. After completing exposure of the film, chemical processing is used to develop the latent images, which are viewed directly or printed on positive paper. Recently, modules have become available for conventional photographic cameras that can convert the conventional camera to an electronic imaging camera. The modules are generally known as electronic film modules or e-film cartridges.

An e-film cartridge generally includes a can section that is used to hold electronic components and an image sensor that is electrically coupled to the electronic components. The image sensor is used to receive images from the camera's lens. The can section is usually constructed to fit within a camera's film cartridge compartment. The electronics within the can section generally include a power supply, a memory, and processing modules to process the data that is received from the image sensor.

The camera's film path is the area of a conventional camera along which the film is run. The camera's optical path is the path from the lens through the shutter to the film path. The film path is generally set so as to be coincident with the optical image plane. An e-film cartridge includes an imager positioned along the film path where the film path and the optical path intersect. The imager is generally rigidly connected to the can section, and is held in place, by a rigid back portion that forms the exterior shell of the e-film cartridge.

Different camera models typically have different distances between the film can area and the area where the optical path and the film path intersect. For example, in 35 mm cameras that are designed to accept standard 35 mm film cassettes, there are no specific standard lateral dimensions for the distance between the optical path and the central axis of a 35 mm film cassette positioned in the camera's can area. An e-film cartridge can generally fit only one camera type that provides a specific distance between the optical path and the film can area. Therefore, there is a need for an e-film cartridge that can fit different camera types.

SUMMARY OF THE INVENTION

The present invention solves these and other problems by providing an e-film cartridge wherein the can section is adjustably coupled to the imager assembly. In one embodiment, the can section contains an image processing element, memory, and/or batteries. The imager assembly is configured to convert an optical image into electrical signals. The imager assembly is adjustably coupled to the can section to allow for a distance variation between the imager assembly and the can section. Thereby allowing the e-film cartridge to be used with many makes and models of conventional film cameras.

In one embodiment, the e-film cartridge includes a can section that contains image processing circuits. The can section has an extension member adaptable to extend generally along a film path of a conventional film camera. The extension member includes conductors that provide electrical signals to the image processing element inside the can section. The e-film cartridge also includes an imager assembly that receives images from the optical path of the camera. The imager assembly includes a connector that is adapted to couple to conductors on the extension member. The spring connector mates with the conductors at varying positions along the conductors.

In an alternate embodiment, the e-film cartridge includes a battery compartment that is adapted to fit within a 35 mm film can area of a conventional film camera. The efilm cartridge has an electronics member that includes a first group of electrical contacts. The electronics member is positioned in the film can section and is slideably coupled to the battery compartment by a sliding connector. The housing of the electronics member is made narrower than the can area of the camera in order to allow the electronics member to moveable inside the film can area. Further, the e-film cartridge includes an imager assembly that is attached to the electronics member. The imager assembly includes a second group of electronic contacts. The first group of contacts is coupled to the second group of contacts.

In use, the imager is first positioned along the film path in alignment with the camera image aperture of the camera. The battery compartment is positioned in the bottom portion of the can area of the camera. In one embodiment, the battery compartment is secured in the can area by a protruding post. (The protruding post is comparable to the portion of a 35 mm film reel that protrudes from a 35 mm film. The reel protrudes from the film can so that the 35 mm film reel can engage the rewind mechanism of the camera). The electronics member is positioned in one of several positions within the can section, as may be dictated by the imager to which the electronics member is attached. Thus, the sliding connector allows for a variation in the position of the imager and electronics member with respect to the stationary battery compartment.

In another embodiment, the e-film's power supply and electronics modules are within an electronics member. The electronics member is rigidly coupled to an imager. The electronics member is movably coupled to a can section housing by a mechanical sliding connector. The can section housing is used to secure the electronic film cartridge to the camera by a protruding post which is used to hold a conventional film can in the can section. There are no electrical contacts between the can section housing and the electronics member. The relative position of the electronics member and the film can housing can be adjusted to position the imager, which is rigidly attached to the electronics member, in alignment with the camera's image aperture.

The present invention additionally provides an imager assembly for receiving images from the aperture of a conventional camera. The imager assembly includes an imager assembly body which is formed to fit substantially within the camera's image aperture. The imager assembly additionally includes at least two positioning members that are coupled substantially on the periphery of the imager assembly body. The positioning members secure the imager assembly relative to the aperture. The connection members can be spring loaded fingers that extend away from the imager assembly periphery.

The imager assembly may additionally include a resilient connector. The resilient connector is electrically coupled to the imager assembly, and is electrically coupled to a first plurality of electrical contacts. The e-film cartridge can also include an electronics housing. The electronics housing can further include electronic elements that are used to process image data. The electronics housing may have an extension member that includes a second plurality of electrical contacts. The second plurality of electrical contacts is electrically coupled to the electronic elements. The extension member can be adapted to couple to the resilient connector in at least two positions along the extension member such that the first plurality of electrical contacts are electrically connected to the second plurality of electrical contacts.

In another embodiment, the imager assembly includes a housing portion, and an adapter member. The housing portion is adapted to fit within a camera's film compartment. The housing portion contains electronics that are used to process digital images. The adapter member is coupled between the housing and the imager assembly to transmit electrical signals between the electronics and the imager assembly.

In another embodiment, the imager assembly additionally includes a housing portion that is adapted to fit within a film compartment of a photographic camera. The housing portion contains electronics that are used to process digital images. The housing portion is also electrically coupled to the imager assembly by a flexible connector. The flexible connector allows for a distance variation between the imager assembly and the housing portion, and electrically couples the imager assembly to the electronics.

The present invention also provides a method of loading an electronic film cartridge into a conventional camera. The method includes the step of placing an imager assembly, which has a first plurality of contacts in communication with the imager assembly, substantially within an aperture of the camera. The method also includes the step of placing a can portion, which has a second plurality of contacts in communication with the can portion, within a can area of the camera such that the first plurality of electrical contacts is in electrical connection with the second plurality of electrical contacts.

One of the unique challenges posed by e-film technology is that most cameras actively sense the presence and/or movement of film within the camera body in order to control operation of the camera. For example, a conventional 35 mm camera typically includes a number of sensors configured to detect the presence of film within the film compartment of the camera and the movement of film along the film path. Thus, an e-film cartridge can be configured to work in conjunction with, or despite the presence of these various sensors.

Another aspect of the present invention includes the realization that at least some conventional 35 mm cameras more readily cooperate with an e-film cartridge if the sensor configured to detect the presence of film is not triggered when the e-film cartridge is disposed in the film compartment of the camera. For example, it has been found that the shutters, apertures, and/or focusing systems of at least some cameras cooperate more readily with an e-film cartridge if the film presence sensor is not actuated.

Thus, according to the further aspect of the present invention, an electronic film cartridge comprises a housing portion adapted to fit within a film compartment of a photographic camera wherein the housing defines an outer contour. The outer contour of the housing is shaped such that the housing does not completely depress at least one of the sensors mounted in the film compartment of the camera when the housing is disposed in the film compartment. By configuring the housing as such, the electronic film cartridge can be inserted into a film compartment of a photographic camera, such as a 35 mm photographic camera, without triggering a film presence sensor for example, thus allowing the camera to operate as if no film were present in the camera.

For example, conventional 35 mm cameras will allow the shutter to be triggered as long as any film in the camera has been properly wound. In particular, if film has been loaded into a conventional 35 mm camera, the shutter mechanism, or electronics, will allow each portion of the film corresponding to a single frame, to be exposed only once. Once the shutter has been triggered, the shutter will not trigger again until the film has been advanced to the portion of the film corresponding to a subsequent frame of the film. Thus, if an electronic film cartridge is disposed within a film compartment and triggers a film presence sensor such that the sensor indicates film is present in the film compartment, the camera may require a film advance sensor to be triggered each time it is desired to trigger the shutter. However, it has been found that when electronic film cartridges disposed within the film compartment and the film presence sensor is not triggered, the shutter can be repeatedly triggered without the need to trigger the film advance sensor. Thus, by constructing the electronic film cartridge such that the housing does not completely depress at least one of the sensors provided in the film compartment, the present electronic film cartridge can operate within the film compartment of a conventional camera without having to provide a separate mechanism for triggering the film advance sensor.

Further aspects, features and advantages of the present invention will become apparent from the detailed description of the preferred embodiments which follow.

BRIEF DESCRIPTION OF THE DRAWINGS

FIG. 4A is a top view of an alternate embodiment of the adjustable e-film cartridge of FIG. 3A;

FIG. 4B is a top view of a camera that the e-film cartridge of FIG. 4A fits within;

FIG. 6B illustrates the adjustable e-film cartridge of FIG. 6A;

FIG. 9B illustrates the e-film cartridge of FIG. 9A;

FIG. 12 is a top plan view of a conventional film canister;

FIG. 13 is a rear elevational view of the film canister shown in FIG. 12;

FIG. 14 is a bottom plan view of the film canister illustrated in FIG. 12;

FIG. 15 is a front elevational view of the film canister illustrated in FIG. 12;

FIG. 16 is a right side elevational view of the film canister illustrated in FIG. 12, illustrating preferred points of contact between DX coding sensors provided in a film compartment of a camera and the outer contour of the film canister;

FIG. 17 is a right side elevational view of an exemplary conventional film canister having DX coding surface; and FIG. 18 is a map illustrating the various portions of the DX coding surface of the film cartridge illustrated in FIG. 17.

DETAILED DESCRIPTION OF THE PREFERRED EMBODIMENT

Figure 1:
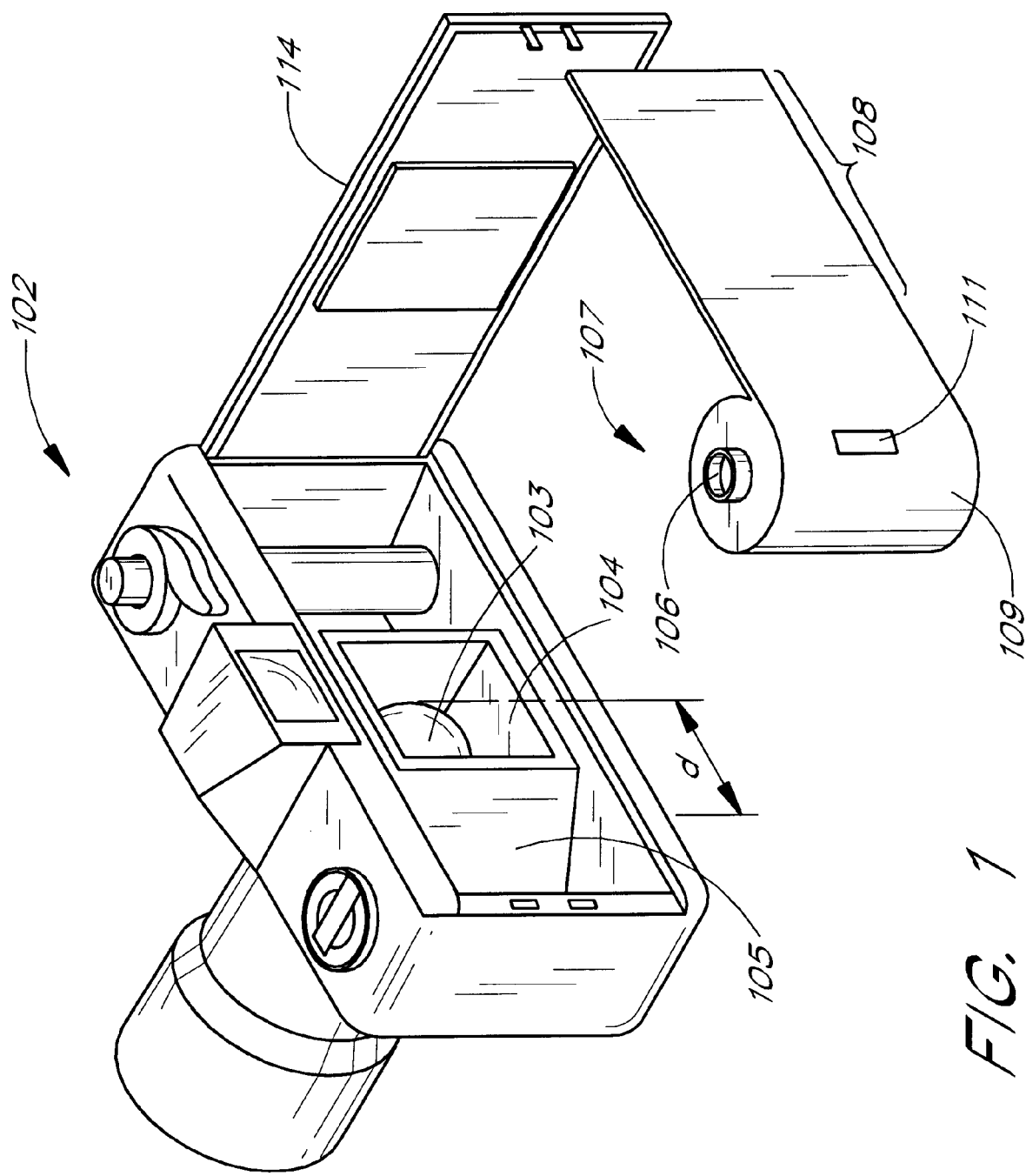
FIG. 1 illustrates a camera and an e-film cartridge.

FIG. 1 illustrates a conventional camera 102 and an e-film cartridge 107 that can be used in the conventional 35 mm camera. The camera 102 includes a lens 103, a film can area 105, and an image aperture (hereinafter aperture) 104. The aperture 104 defines a first end of the camera's optical path. The lens 103 defines a second end of the camera's optical path. The lens 103 is used to focus images on the film, which is located along the film path. The aperture 104 is typically formed from a rectangular opening that is usually tapered to the lens 103. Further, the camera 102 includes a can area 105, within which a conventional film cassette is secured by a peg extension (not shown). A predefined distance "d" is provided between the can area 102 and the centerline of the image area, that is, the area where the optical path intersects the film path. The camera 102 also includes a back cover 114 to secure the conventional film cassette and unexposed film along the film path inside the camera. The camera back 114 is also used to prevent the film in the film path from unwanted exposure. The camera back 114 is used to secure the e-film cartridge 107 in the film can area 105.

The e-film cartridge shell 109 is made of plastic, metal, or similar materials. At a first end, the shell includes a can section 106. A rectangular back extension 108 extends from the periphery of the can section 106. The rectangular back extension 108 is used to hold an imager assembly (shown in FIG. 2) in position relative to the aperture 104. As may be appreciated from FIG. 1, the relative positions of the can section 106 and the imager assembly 202 are fixed such that the optical center line of the image sensor is aligned with the optical center line of the lens aperture. Thus, the efilm 107 of FIG. 1 can generally only be used in a camera with the particular dimensions for which the e-film cartridge was designed.

Figure 2A:
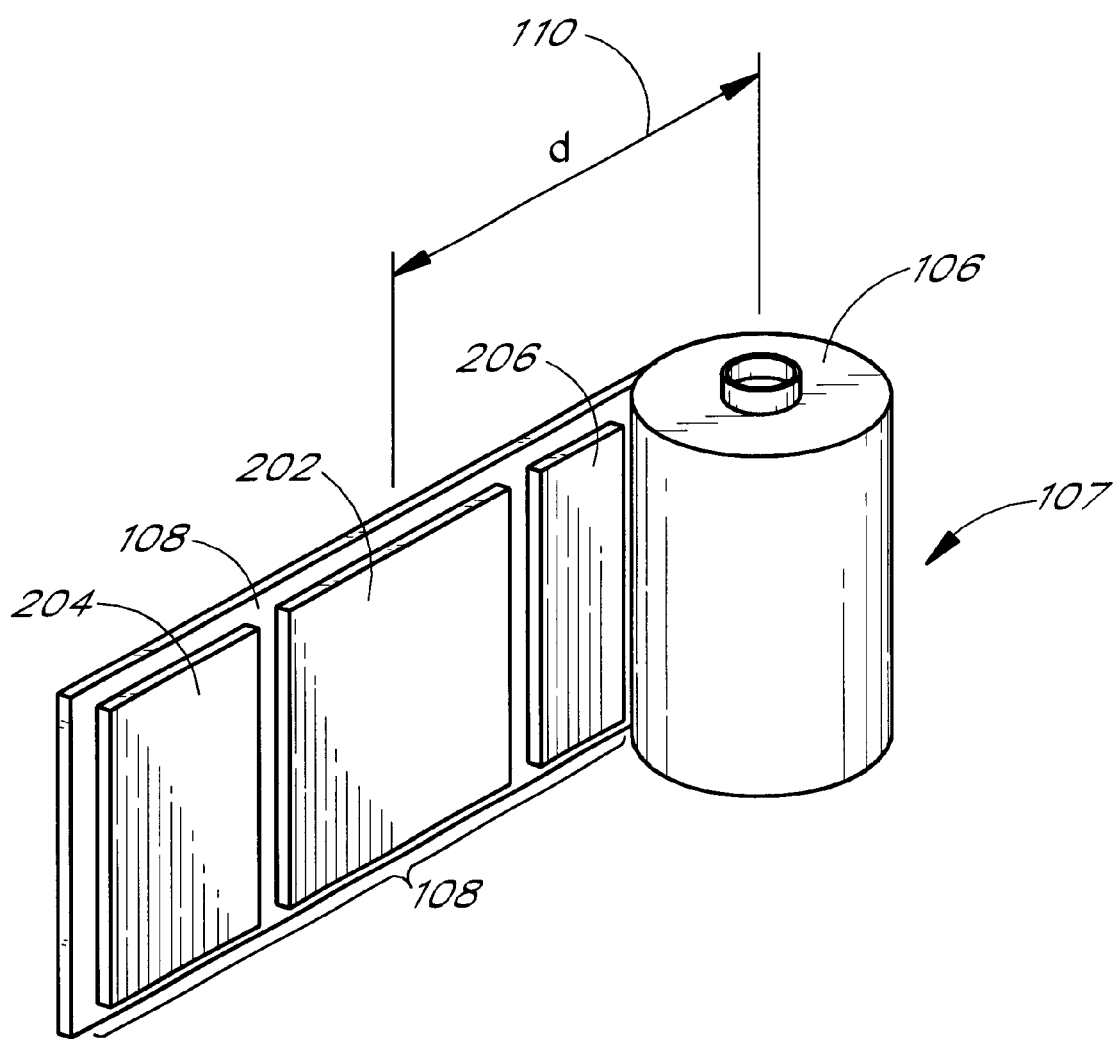
FIG. 2A illustrates an e-film cartridge.

FIG. 2A is a front view of the e-film cartridge 107 of FIG. 1. The e-film cartridge 107 includes an imager assembly 202 positioned generally in its center portion. The e-film cartridge 107 includes processing and storage circuits, battery, etc. The battery is typically provided inside the can section 106. At least a portion of the processing and storage circuits are typically located inside the can section 106. In some embodiments, portions of the processing circuits (shown as circuit elements 204 and 206 in FIG. 2A) are also located on the flag portion 108. The imager assembly 202 is electrically coupled to the processing unit to communicate with the processing circuits and to receive power from the battery. Wires or other conductors are provided within the e-film shell to electrically couple the processing unit to the imager assembly 202.

Figure 2B:
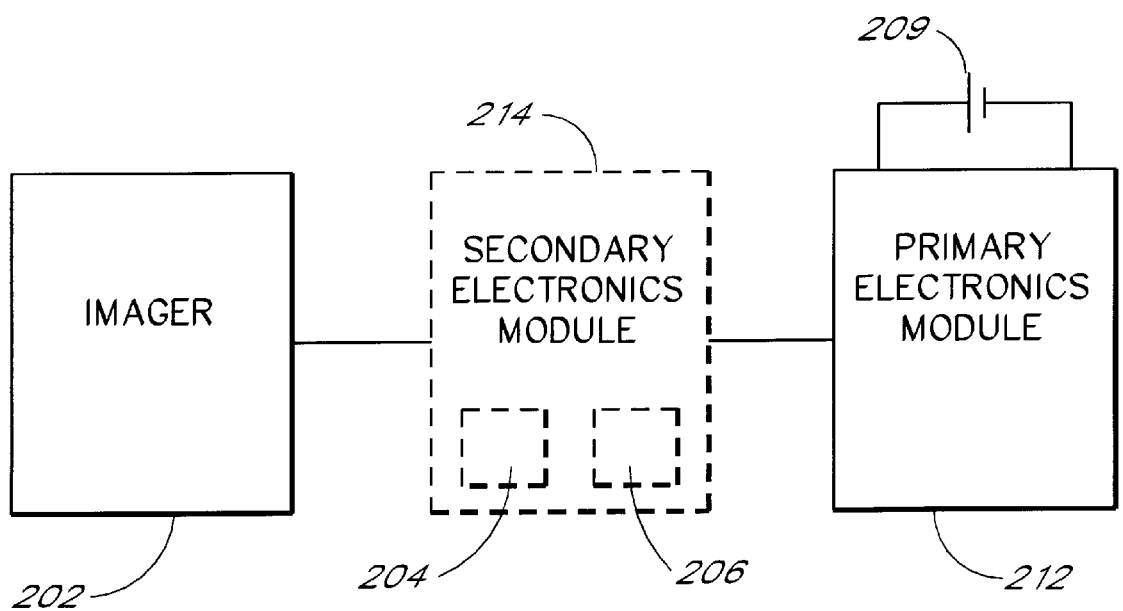
FIG. 2B is a block diagram of the logical arrangement of the modules of an e-film cartridge.

FIG. 2B is a circuit block diagram of the e-film cartridge 107. The circuit includes a primary electronics module 212, a battery 209, an optional secondary electronics module 214, and an imager assembly 202. The primary electronics module 212 is coupled to the battery 209 to receive power for the primary electronics module components. The primary electronics module is typically located in the can portion 106.

The optional secondary electronics module 214 (including, for example, the circuits 204 and 205 shown in FIG. 2A) can be provided addition to the primary electronics module. The imager assembly 202 is used to convert an optical image into electrical signals.

With reference to FIG. 1, a display 111 is disposed on an outer surface of the e-film cartridge 107. The display 111 can be driven by the primary electronics module 212 and/or the secondary electronics module 214, depending on the information to be displayed on the display 111. Preferably, the display 111 is in the form of a liquid crystal panel.

As shown in FIG. 1, the display 111 is positioned on an side of the e-film cartridge 107 which faces away from the film can area 105. As is known in the art, conventional film canisters include indicia on the outer surface thereof, which indicate the number of exposures and the speed of the film. Additionally, conventional 35 mm cameras usually include a window on the film back cover so as to allow a user to see the indicia on the outer surface of the film canister when the film canister is installed into the film compartment of the camera. Thus, the display 111 preferably is positioned such that when the e-film cartridge 107 is disposed within the film can area 105, the display 111 can be seen through a window (not shown) provided on the back cover 114.

Figure 3A:
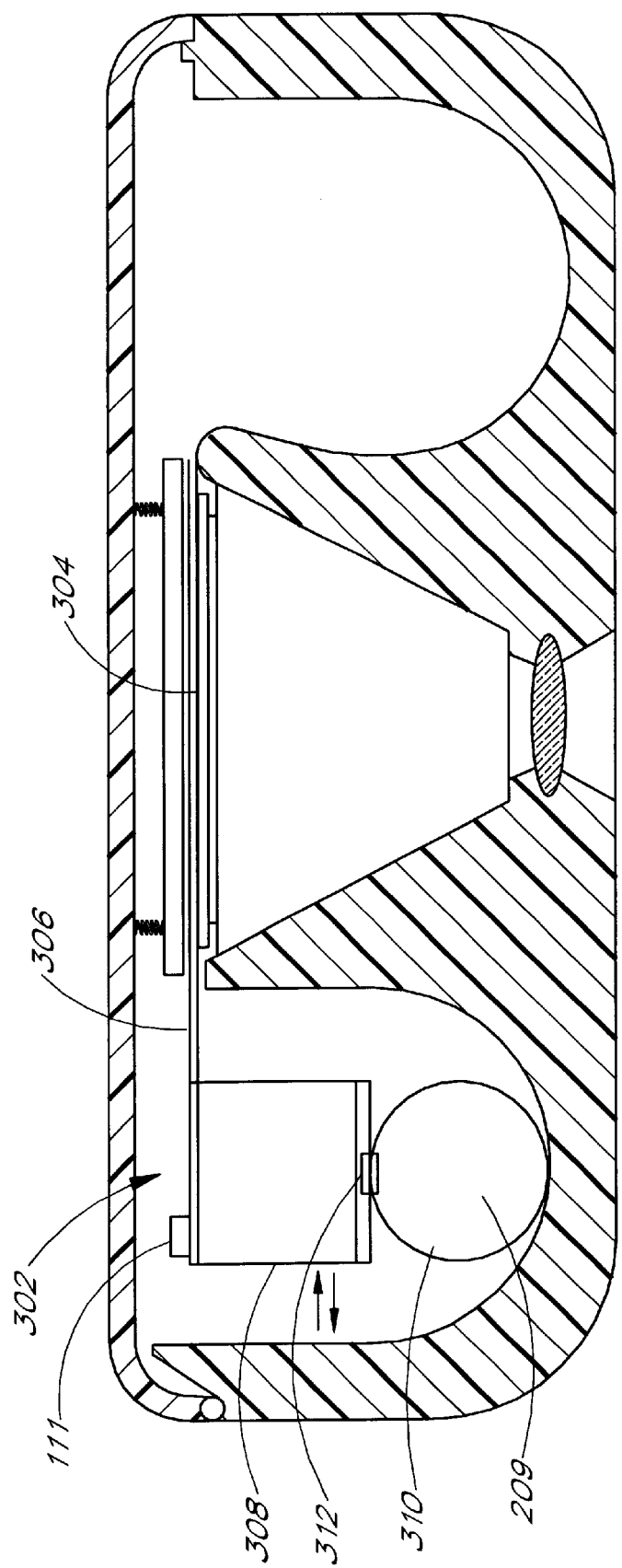
FIG. 3A is a top view of an adjustable e-film cartridge within a camera.

The e-film cartridge shown in FIG. 2A is a non-adjustable cartridge in that the distance between the can portion 106 and the imager 202 is fixed. FIG. 3A illustrates one embodiment of an adjustable e-film cartridge 302. The e-film cartridge 302 includes an imager assembly 304, a back support portion 306, an electronics housing 308, and a battery compartment 310. The imager assembly 304 is used to receive images from the cameras optical path as is generally known in the art. The imager assembly can be constructed using any image array technology including Charge Coupled Device (CCD) arrays, Complementary Metal Oxide Semiconductor (CMOS) arrays, and the like. The imager assembly 304 is coupled to the electronics housing 308 by the back support 306. The back support 306 preferably includes conductive elements to transport signals from the imager assembly 304 to the electronics housing 308. The electronics housing 308 includes various electronic components that are used to implement the image processing and image retrieval functions of the e-film cartridge 302. The battery compartment 310 holds the battery 209 that supplies power to components of the e-film cartridge 302. In one embodiment, the battery compartment 310 is held in place in the film can area by a protruding post, which is used to secure a conventional film can within the film can area.

The electronics housing 308 is movably coupled to the battery compartment 310 by a sliding connector 312. The sliding connector 312 provides a movable electrical connection between the battery compartment 310 and the electronics housing 308. The sliding connector assembly 312 allows the electronics housing 308 to move laterally with respect to the battery compartment 310. The movement of the electronics housing 308 results in the imager assembly's movement along the film path of the camera because the electronics housing is rigidly connected to the imager assembly by the back support portion 306. Thus, the position of the electronics housing 308 within the film can area is determined in accordance with the particular dimensions of the camera. For example, in a camera with a greater distance between the film can area and the film aperture's optical center, the electronics housing may be positioned closer to the interior end of the film can area. In a camera with a shorter distance between the film can area and the film aperture's optical center, the electronics housing may be positioned closer to the exterior end of the film can area. Therefore, the e-film cartridge 302 of FIG. 3A allows for a proper imager assembly positioning by varying the relative position of the electronics housing with respect to the film can area. As may be appreciated, the electronics housing position variation is dictated by the spacing between the sides of the film can area and sides of the electronics housing 308. In another embodiment, the electronics housing 308 is narrower so as to accommodate a greater range of movement.

Figure 3B:
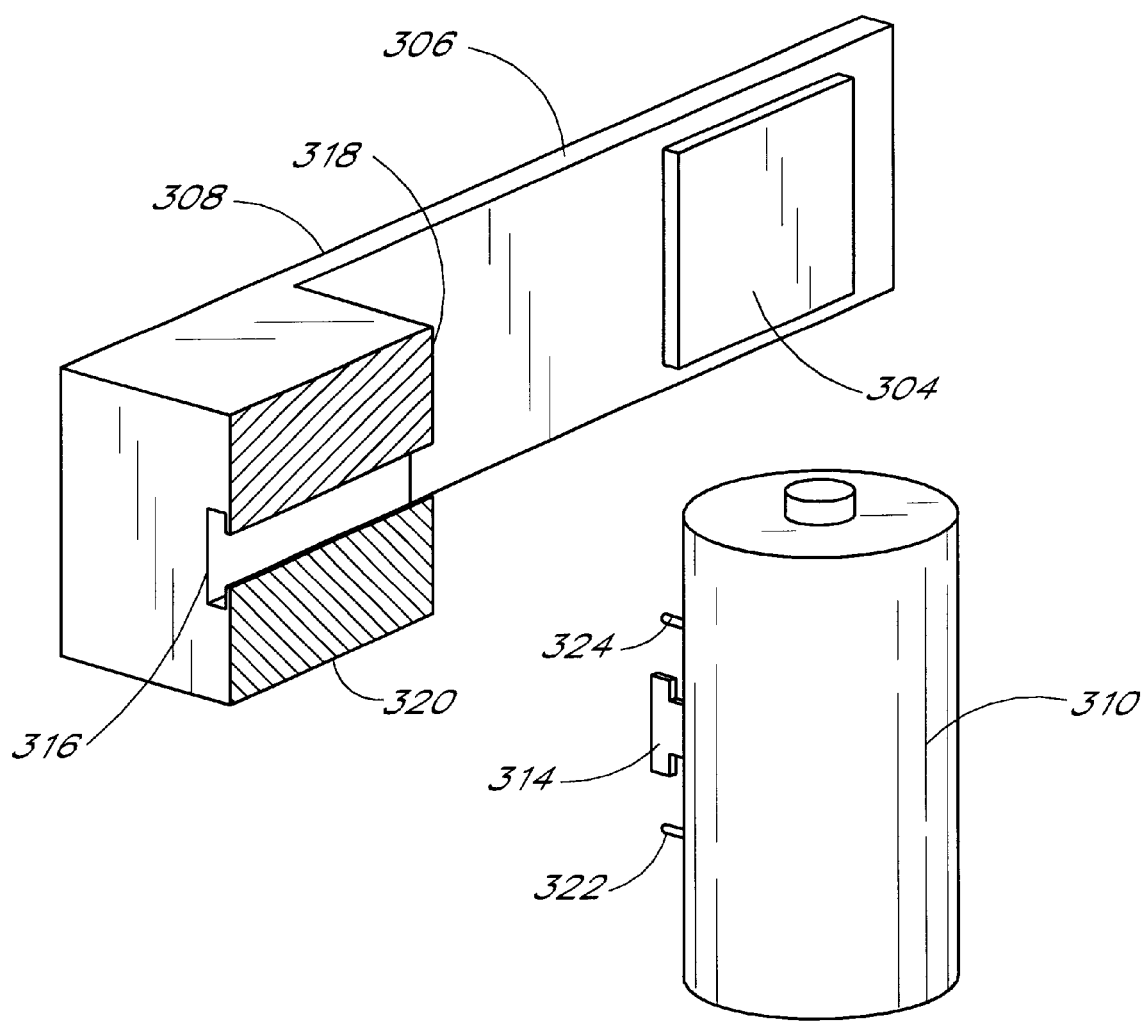
FIG. 3B illustrates the e-film cartridge of FIG. 3A.

FIG. 3B illustrates the e-film cartridge of FIG. 3A in an exploded component view. The electronics housing 308 advantageously includes a channel 316 that can receive a guiding member 314 from the battery compartment 310. The guiding member 314 allows the battery compartment 310 to move along the electronics housing 308, when outside the camera. The electrical connection between the electronics housing 308 and the battery 209 within the battery compartment 310 is facilitated by a pair of contacts 322, 324 and associated contact strips 318, 320. The first contact 322 is in electrical connection with the first contact strip 320, when the guiding member 314 is within the channel 316. Also, the second contact 324 is in electrical connection with the second contact strip 318, when the guiding member 314 is within the channel 316. An electrical connection within the back support portion 306 provides an electrical connection between the imager assembly 304 and the battery 209.

In another embodiment, the power supply elements and the electronic components of the e-film cartridge are all in an electronics housing. A can portion does not contain electronic elements. The battery that is within the battery compartment in FIG. 3A, is inside the electronics housing. Thus, a purely mechanical sliding connector can be used to couple the can portion to the electronics housing. Further, no electrical signals are transmitted through the sliding connector. Thus, this embodiment of the e-film cartridge has all electronic components within a single rigid element.

FIG. 4A illustrates an alternative embodiment of an e-film cartridge. The e-film cartridge 402 of FIG. 4A includes a sliding connector 404, an electronics housing 406, an imager assembly 409, a back support 408, and a battery compartment 410. The imager assembly 409 is coupled to the electronics housing 406 by the rigid back support 408. The electronics housing 406 is adapted to fit within the film can area 105. The electronics housing 406 is coupled to the battery compartment 410 by a sliding connector 404. The sliding connector 404 allows the electronics housing 406 to move tangentially with respect to the circular battery compartment 410. The movement of the electronics housing 406 allows for an imager assembly position variation 409 along the camera's film path. Circuit boards 412 are illustrated within the electronics housing 406. The circuit boards 412 are used to hold electronic components that are used to processing images. The battery compartment 410 is used to hold the battery 209 that supplies power to the various electronic components of the e-film cartridge 402.

The electronics housing 406 of FIG. 4A is contoured to fit within a film can compartment of certain curved back cameras. At times, a camera's film loading area 416 may be shaped to receive a film cassette such as a 110 mm film cassette, as is illustrated in FIG. 4B. The camera's film loading area 416 may include a can area 415 that has a tapered top portion 414. The tapered top portion 414 is such that the side of the can area that is near the camera's exterior end is angled towards the camera's back center. The e-film cartridge 402 of FIG. 4A is adapted to fit within such can area 415.

Figure 4C:
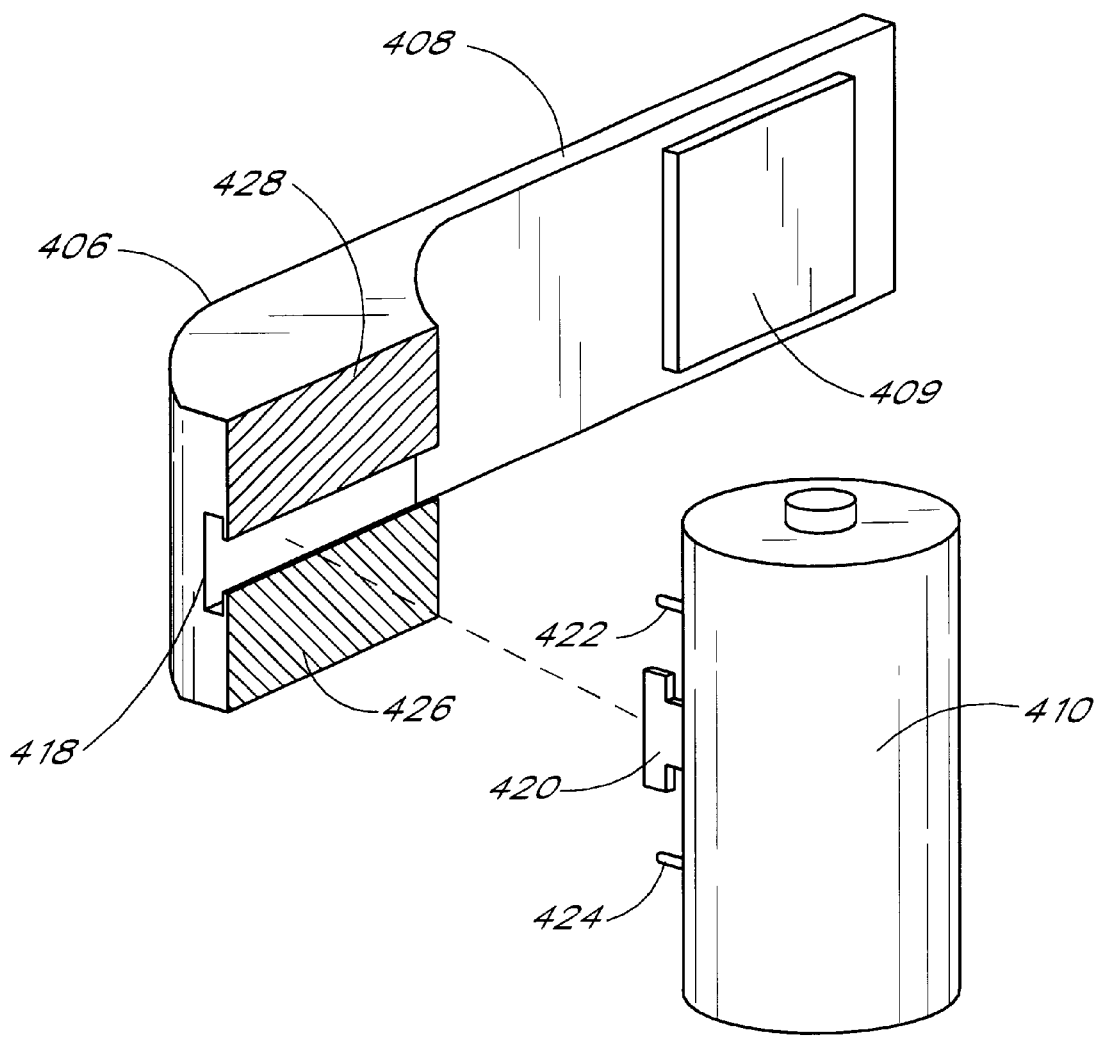
FIG. 4C illustrates the e-film cartridge of FIG. 4A.

FIG. 4C illustrates the e-film cartridge of FIG. 4A in an exploded component view. The electronics housing 406 advantageously includes a channel 418 that can receive a guiding member 420 from the battery compartment 410. The guiding member 420 allows the battery compartment 410 to move along the electronics housing 406, when outside the camera. The electrical connection between the electronics housing 406 and the battery 209 within the battery compartment 410 is facilitated by a pair of contacts 422, 424 and associated contact strips 426, 428. The first contact 422 is in electrical connection with the first contact strip 428, when the guiding member 420 is within the channel 418. Also, the second contact 424 is in electrical connection with the second contact strip 426, when the guiding member 420 is within the channel 418. An electrical connection within the back support portion 408 provides an electrical connection between the imager assembly 409 and the battery 209.

Figure 4D:
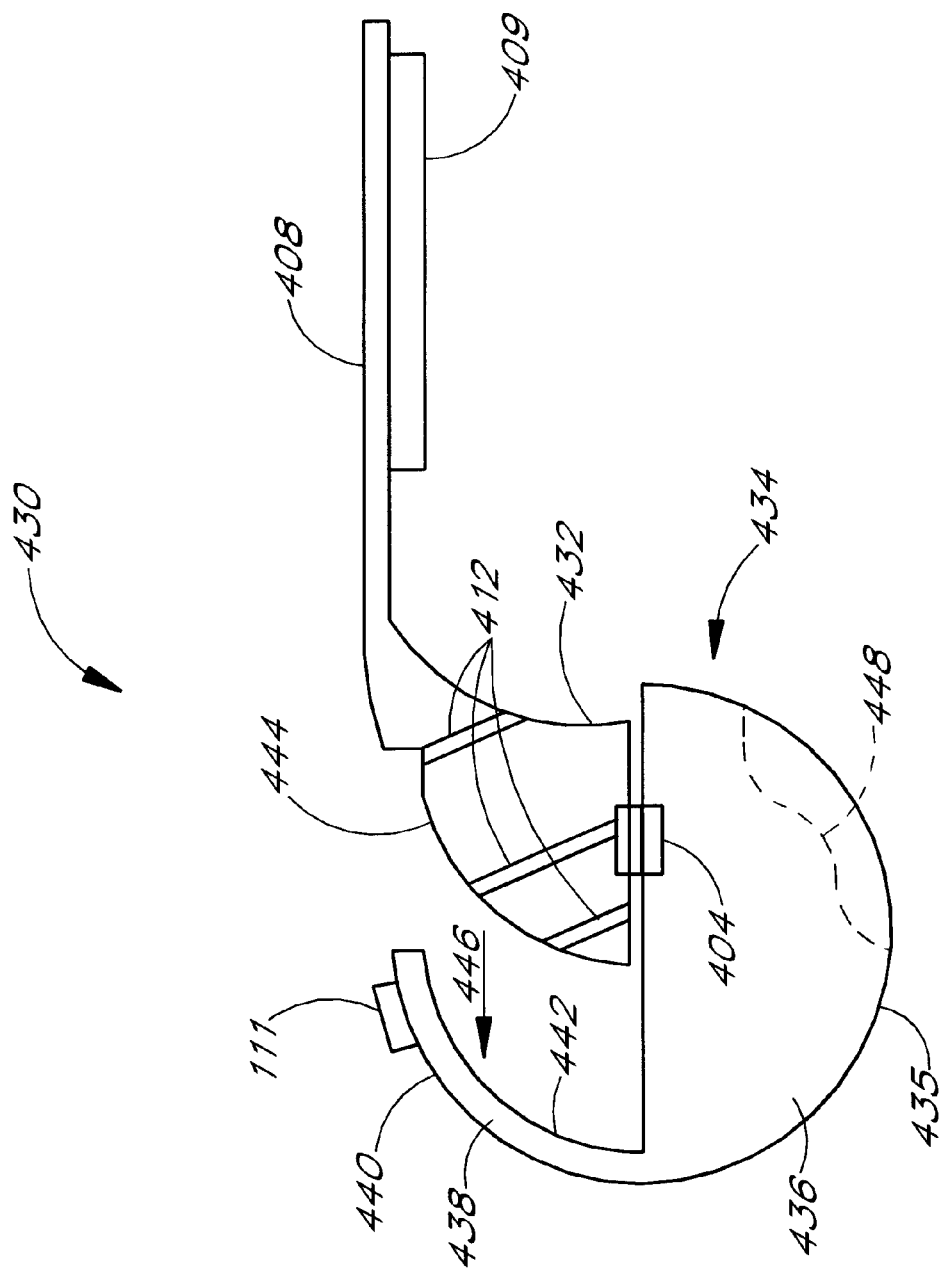
FIG. 4D illustrates a modification of the e-film cartridge shown in FIGS. 4A–4C.

FIG. 4D illustrates a modification of the e-film cartridge 402 shown in FIGS. 4A–4C. The e-film cartridge 430 shown in FIG. 4D is constructed substantially identical to the e-film cartridge 402 shown in FIGS. 4A–4C, except as noted below. Thus, the same reference numerals have been used to identify identical components.

As shown in FIG. 4D, the e-film cartridge 430 includes a sliding connector 404, an electronics housing 432, an imager assembly 409, a back support 408, and a battery compartment 434 having an outer surface 435. In the present modification, the battery compartment 434 includes a semicircular body portion 436 and an arm 438 extending from the body portion 436. The imager assembly 409 is coupled to the electronics housing 432 by the rigid back support 408. The electronics housing 432 is adapted to fit within the film can area 105. The electronics housing 432 is coupled to the battery compartment 434 by the sliding connector 404. The sliding connector 404 allows the electronics housing 432 to move relative to the battery compartment 434, similarly to the movement between the electronics housing 406 and the circular battery compartment 410 discussed above with reference to FIGS. 4A–4C.

In the present modification, the outer surface 435 of the battery compartment is curved so as to generally conform to a curvature of an inner surface of a film can area of a conventional camera, such as the film can area 105 illustrated in FIG. 1. Additionally, the arm includes an outer surface 440 and an inner surface 442. The outer surface 440 of the arm 438 preferably forms a substantially continuous extension of the outer surface 435 of the battery compartment 434. As such, the arm 438 provides an additional anchoring effect to the entire e-film cartridge 430, thus further stabilizing the position of the e-film cartridge 430 within a film can area such as the film can area 105 illustrated in FIG. 1. It is readily apparent to one of ordinary skill in the art that the shape of the outer surfaces 435, 440 can be adapted to conform to the inner surface of any film can area on any type of conventional camera, including but without limitation, 35 mm and 110 mm.

As shown in FIG. 4D, the electronics housing 432, can include a recess 444 in a juxtaposed position relative to the inner surface 442 of the arm 438. In the present modification, the recess 444 allows for a tight fit between the battery compartment 434 and the electronics housing 432. For example, when the electronics housing 432 is moved in the direction indicated by arrow 446, to a position in which the recess 444 is closest to the inner surface 442 of the arm 438, the arm 438 is received by the recess 444. Thus, the recess 444 allows the arm 438 to be provided with any desired thickness while preserving the adjustability of the electronics housing 432 relative to the battery compartment 434.

The e-film cartridge 430 optionally can also include a recess 448 for avoiding contact with DX coding sensors, as discussed below in more detail with reference to FIGS. 10–18.

Figure 5A:
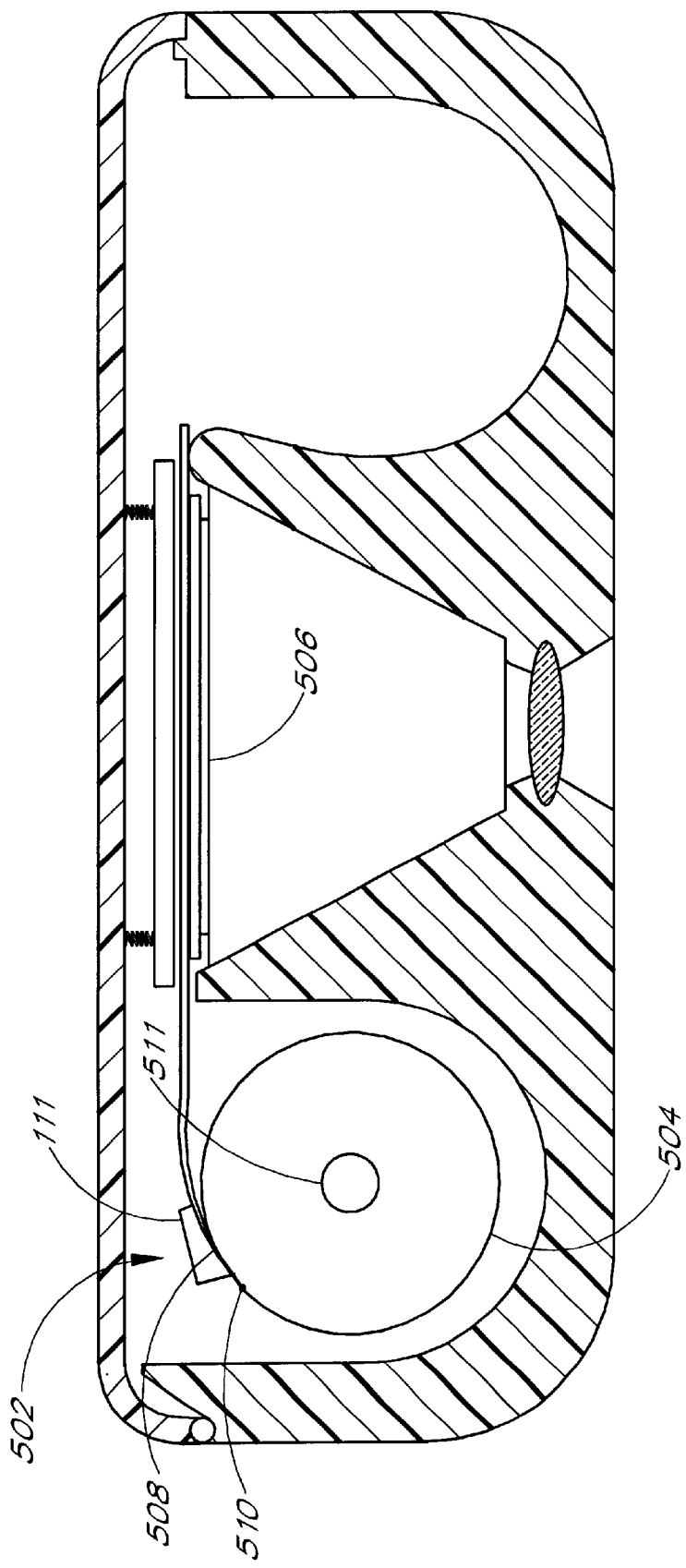
FIG. 5A is a top view of an adjustable e-film cartridge with a flexible adapter portion that is positioned within a camera.

FIG. 5A illustrates the use of a flexible circuit to couple an imager assembly to the e-film's processing unit. The e-film cartridge 502 of FIG. 5A includes a processing unit 504, an imager assembly 506, and a flexible circuit 508. The imager assembly 506 is secured within the aperture by a securing member (not shown) or by the camera back, such that the imager assembly 506 is stable when receiving images from the optical path. The securing member may include spring fingers that extend into the aperture, an adhesive material that attaches to the aperture opening, or a suction cup on the sides of the imager assembly 506. The imager assembly 506 is coupled to the processing unit by the flexible circuit 508. The flexible circuit 508 is connected to the cylindrical processing unit shell 504 at a point 510 that is removed from the camera's film path by some rotational degree. The flexible circuit 508 may be made from known flex circuit materials which typically have electronic components connected to flexible copper conductors bonded to a thin flexible plastic insulating base material such as, for example, mylar, kapton, and the like. The flexible circuit 508 is used to transport electrical signals between the imager assembly 506 and the processing unit 504. The processing unit 504 is seated within the can area by a post (not shown). The processing unit cavity that is positioned on the post defines the center axis 511. Also, the imager assembly 506 is used to receive images from the camera's optical path as discussed above. Further, the processing unit 504 includes an electronics module (not shown) and a battery module (not shown) that are used to facilitate the image processing functions of the e-film cartridge 502.

Figure 5B:
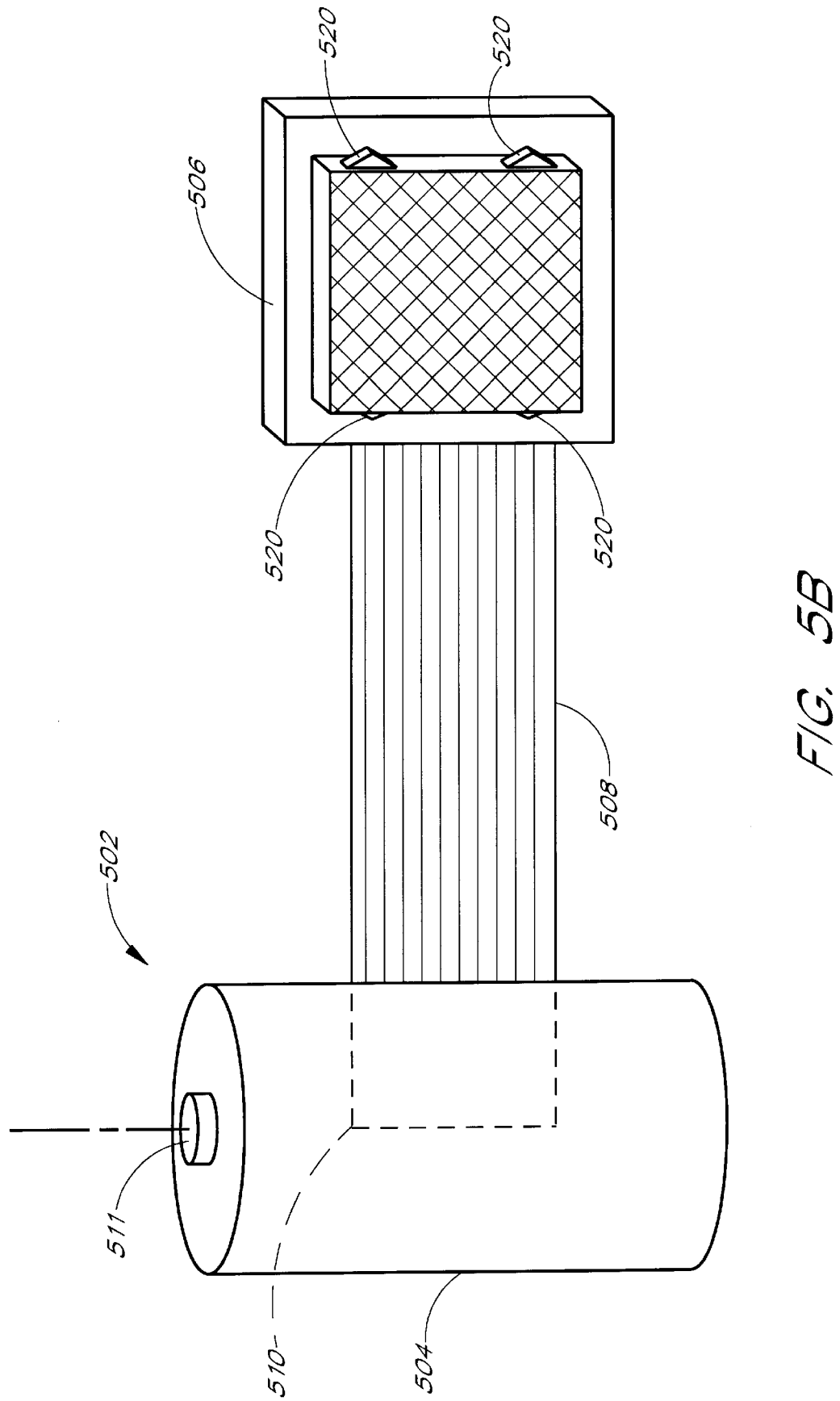
FIG. 5B illustrates the e-film cartridge of FIG. 5A.

FIG. 5B illustrates one embodiment of the e-film cartridge of FIG. 5A when outside a camera film compartment. The e-film cartridge includes a flexible circuit 508 such as a ribbon connector to couple the processing unit 504 to the imager assembly 506. In one embodiment, the imager assembly 506 includes spring fingers 520 on the periphery of the imager assembly to secure the imager assembly within the camera's aperture.

The position of the imager assembly 506 along the film path can be adjusted by rolling the processing unit housing 504 around its center axis 511. The processing unit housing 504 can be rolled while inside the can area to adjust the length of flex circuit 508 that extends to the film path. Alternatively, the processing unit 504 can be rolled outside the can area prior to being inserting into the camera. Further, the processing unit 504 and the imager assembly 506 can be positioned within a camera without any adjustments, while allowing the flex circuit 508 to bunch together or, alternatively, stretch, along the film path.

Figure 6A:
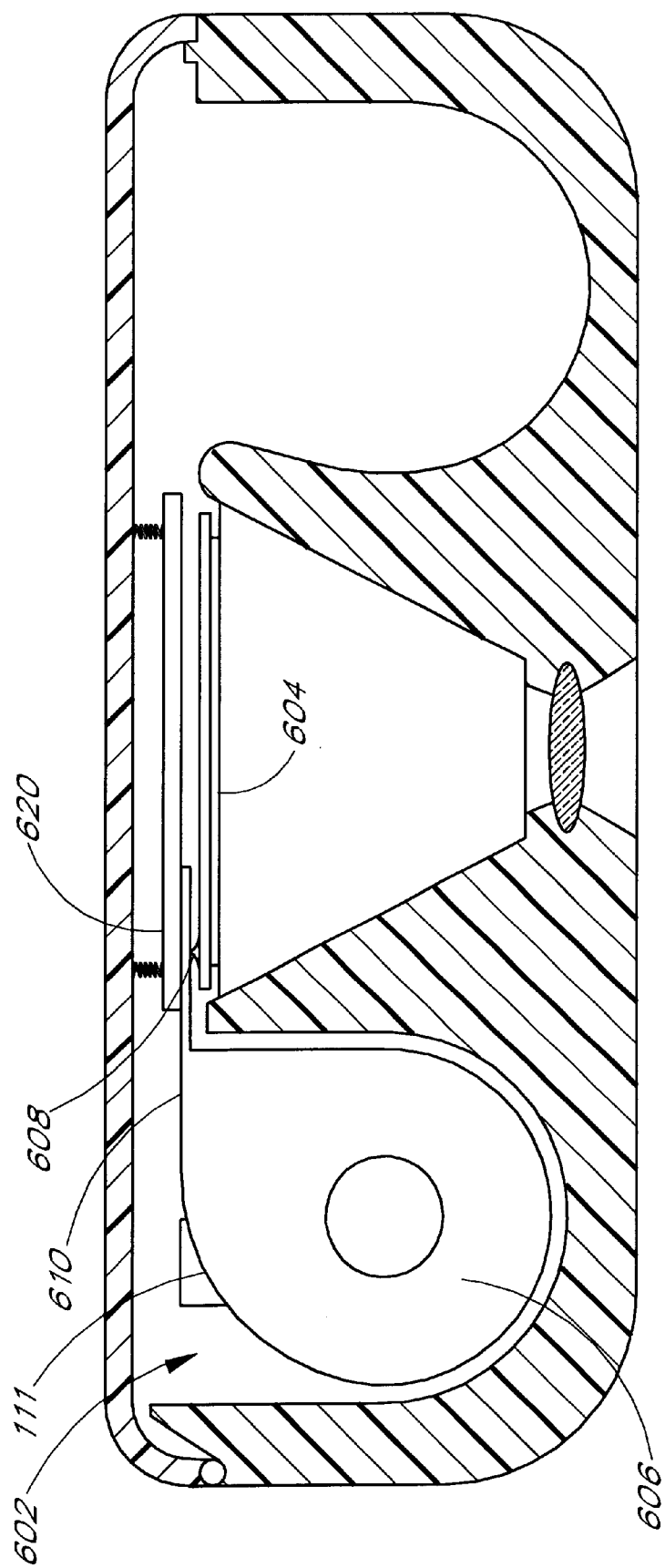
FIG. 6A is a top view of a two-piece adjustable e-film cartridge that is positioned within a camera.

FIG. 6A illustrates an embodiment of the adjustable e-film cartridge of the present invention, which employs detachable components. The electronic film cartridge 602 of FIG. 6A includes an imager assembly 604 and a can member 606. The imager assembly 604 is coupled to the can member 606 by a resilient connector 608 on the imager assembly 604 and associated conductive traces on the can member 606. The imager assembly 604 includes a resilient connector 608 on the proximal end of the imager assembly. The resilient connector 608 is preferably facing toward the back cover of the camera. The can member 606 terminates with an advantageously rigid extension member 610 that is generally parallel to the camera's film path.

The extension member 610 includes traces (not shown) that are deposited with conductive material. The extension member 610 rests on the resilient connector 608 to provide for an electrical connection between the imager assembly 604 and the electronics within the can member 606. The extension member 610 overlaps the resilient connector 608 so as to allow for an adjustment in the relative position of the extension member and the resilient connector. As may be appreciated from FIG. 6A, the adjustment range is generally proportional to the length of the extension member 610. The pressure applied to the extension member 610 by the camera's back compresses the resilient connector 608 against the extension member traces to provide for a reliable electrical connection between the can member 606 and the imager assembly 604. Also, the can member 606 includes the electronics and power supply units that are used to process images received by the imager assembly as discussed above.

FIG. 6B is an exploded view of the components of the e-film cartridge of FIG. 6A. The can member 606 includes an extension member 610 that tangentially extends from the can member. Electrical traces 616 are preferably provides on the bottom surface of the extension member 610. The electrical traces 616 are advantageously gold-plated contacts. The imager assembly 604 includes a resilient connector 608. The resilient connector 608 preferably has several resilient electrical contacts 618 lined-up from one end of the connector to the other. Each resilient electrical connector 618 is preferably a gold plated copper wire contact. The imager assembly additionally includes guiding rails 612, 614 to ensure proper alignment between the electrical traces 616 on the extension member 610 and the resilient electrical contacts 618 on the imager assembly 604. The guiding rails 612, 614 ensure that each one of the electrical traces 616 mates with the corresponding resilient electrical contact.

The imager assembly 604 is independently loaded onto the camera regardless of the relative can area location in the particular camera. The imager assembly 604 is generally not removed from the camera when pictures are downloaded from the e-film cartridge. Generally, to download pictures, the cartridge is removed from the camera and inserted into an image retrieval module. When the electronic film cartridge includes a single housing portion for the imager assembly and the processing unit, the two components are removed from the camera. The removal of the imager assembly from the camera can damage the imager assembly by introducing dirt and other contaminants to the imager's surface. Further, the removal of the imager assembly from the camera increases the likelihood that the imager assembly will be damaged as a result being dropped. Thus, by providing an e-film cartridge 602 which does not require the imager assembly to be connected to the processing unit at all times, the imager assembly 604 is further protected from such hazards.

Additionally, the two-piece e-film cartridge allows for upgrading the imager assembly without purchasing a new processing module. Thus, a consumer can initially purchase a low cost imager assembly. At a later time, the consumer can upgrade to a more expansive imager assembly without purchasing a new processing module. Alternatively, a consumer may wish to switch between a black and white imager assembly and a color imager assembly, depending on the subject. The two-piece cartridge allows for the efficient interchangeability of imager assemblies.

Figure 7:
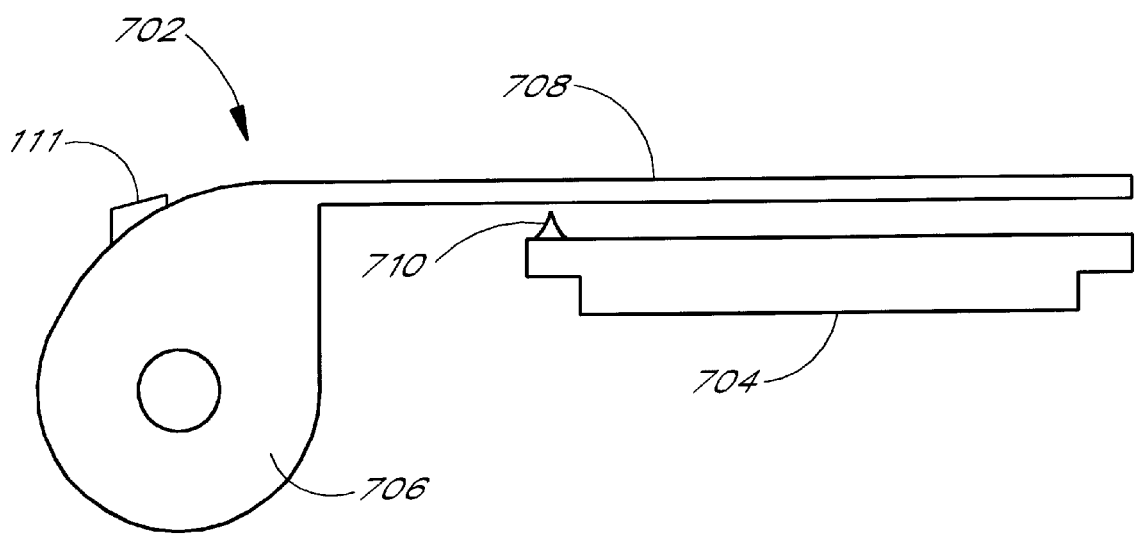
FIG. 7 is a top view of an alternate embodiment of the adjustable e-film of FIG. 6A.

FIG. 7 illustrates an adjustable e-film cartridge 702 with an extension member 708 that overlaps the entire length of the imager assembly 704. By providing a longer extension member 708, the adjustability range for the imager assembly 704 is increased in comparison to the cartridge of FIGS. 6A and 6B.

Figure 8:
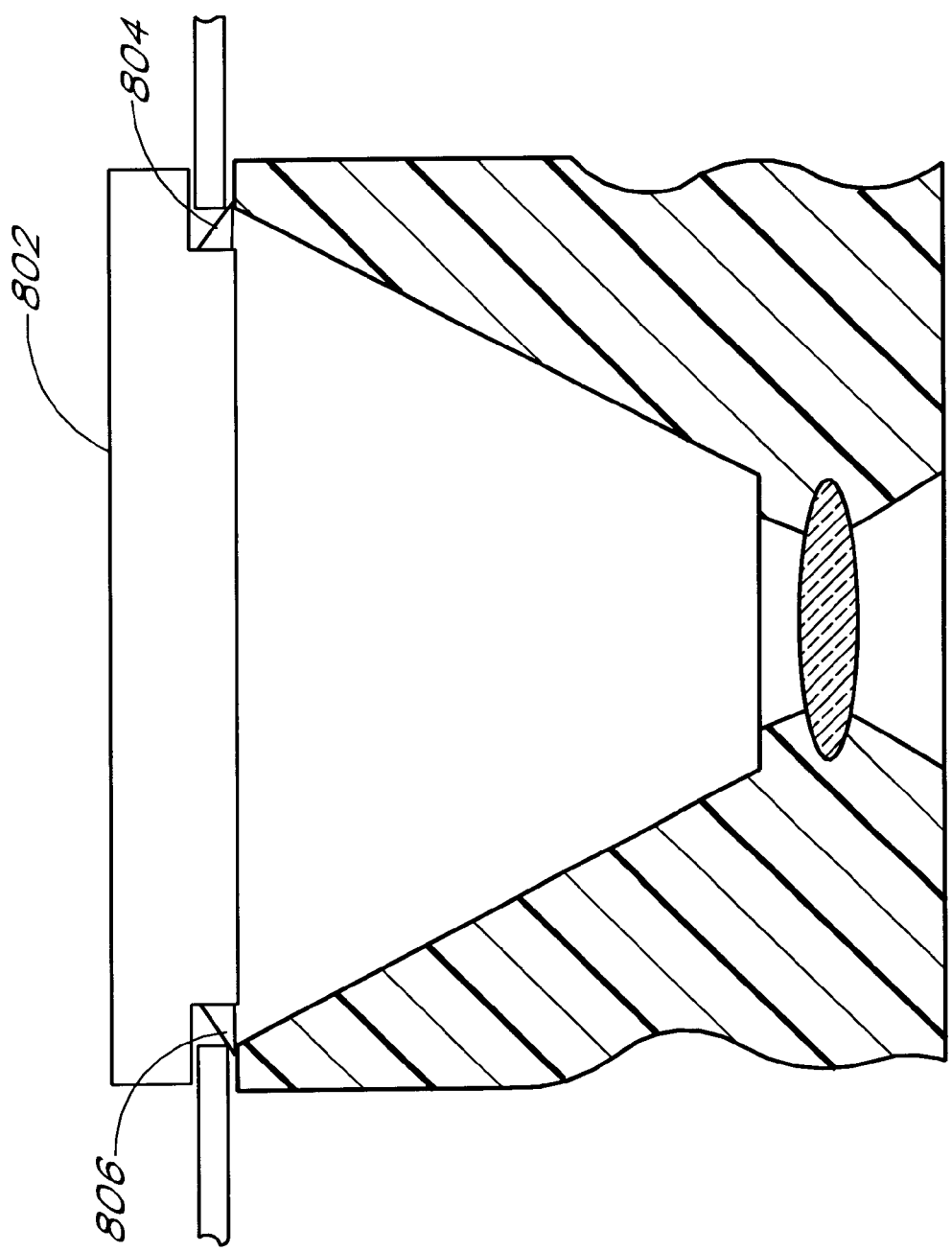
FIG. 8 illustrates an imager assembly that is secured within an aperture by spring fingers.

FIG. 8 illustrates the spring fingers 804, 806 that are used to secure the imager assembly 802 within the aperture. The imager assembly 802 is secured in position inside the aperture by spring-loaded fingers 804, 806 that extend from the sides of the imager assembly into the camera's shutter framewall. The spring-loaded fingers 804, 806 apply pressure against the camera's shutter framewall and hold the imager assembly 802 in position when the camera's back is open.

Figure 9A:
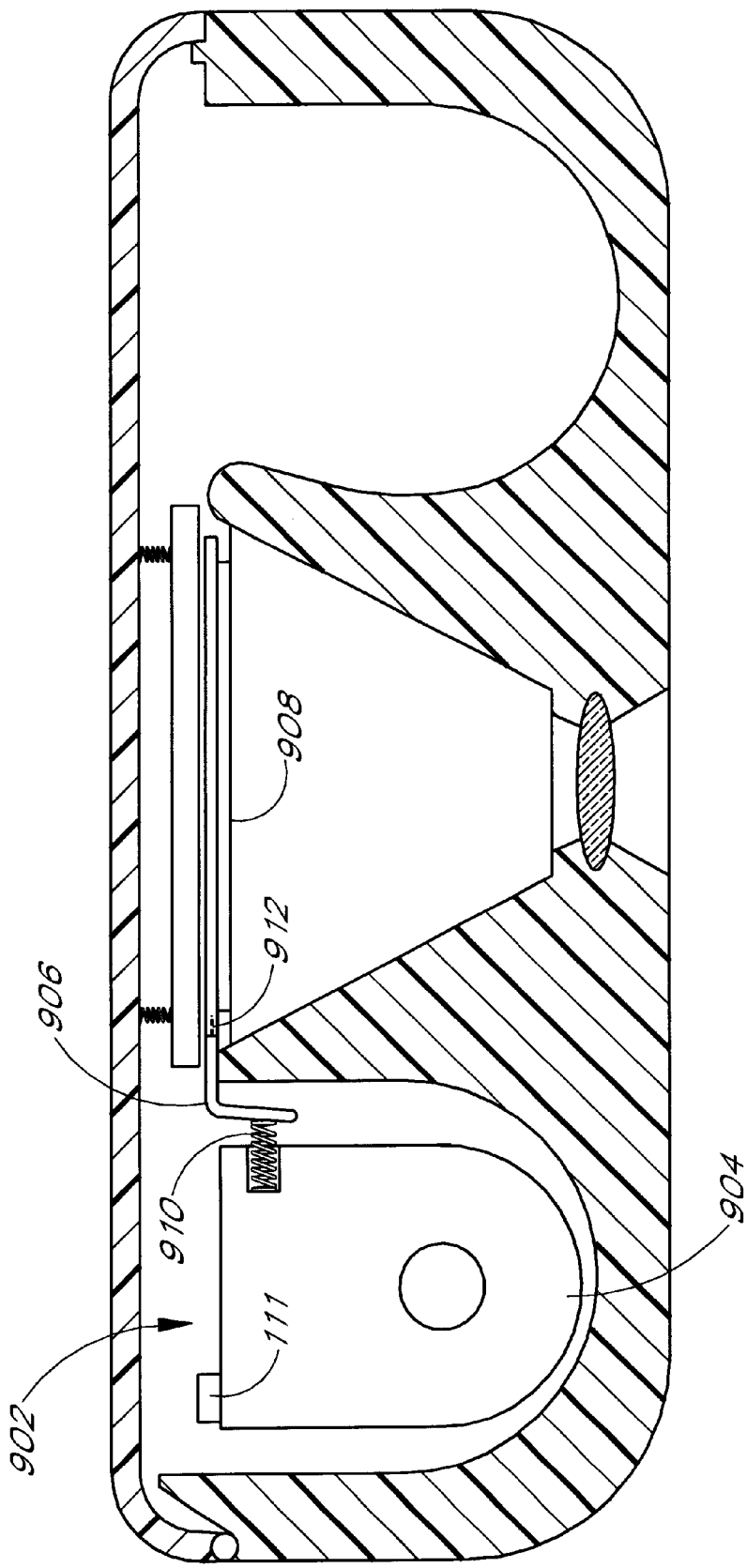
FIG. 9A is a top view of a three-piece adjustable e-film cartridge positioned within a camera.

FIG. 9A illustrates an adjustable e-film cartridge 902 that includes three components. The adjustable e-film cartridge 902 includes a can section 904, an adapter member 906, and an imager assembly 908. The can section 904 includes electronic components and a power supply element that are used to facilitate the image processing image retrieval functions of the e-film cartridge 902, as discussed above. The can section 904 is coupled to an adapter member 906 by a resilient connector 910. The resilient connector 910 applies pressure against traces of the adapter member 906 to provide an electrical connection between the electronic components in the can section 904 and the traces on the adapter member 906. The adapter member 906 is coupled at a second end to the imager assembly 908 by a connector 912. In one embodiment, the connector 912 can be a LIF (low insertion force) connector, a ZIF (zero insertion force) connector, and the like. The connector 912 is on the imager assembly's proximal end. The adapter member 906 is provided in dimensions that are specific to the particular camera.

Different adapter members are provided for cameras with different dimensions. Thus, the same imager assembly and can section can be used in different size cameras. The use of the adapter member 906 further allows the imager assembly 908 to remain within the camera while the can section 904 is removed from the camera when downloading images from the electronics inside the can section. The adapter. is advantageously made in several sizes, each adapter size fitting several camera models. For example, a first size adapter may fit within a first camera and a second camera that share a common distance between the can area and the center of the aperture.

FIG. 9B is an exploded view of the e-film cartridge of FIG. 9A. The can section 904 includes a spring-loaded connector assembly 910. The spring-loaded connector assembly 910 is adapted to couple to a connector 916 on a first end of the adapter member 906. The spring-loaded connector assembly 910 is advantageously composed of gold plated spring and associated connector leads. The connector 916 on the first end of the adapter member 906 is preferably a gold plated edge connector. The adapter member includes a second connector 912 on a second end of the adapter member. The second connector is adapted to couple to an imager assembly connector 914. The imager assembly connector 914 may be provided on the side of the imager assembly 908, on the top of the imager assembly, or on the bottom of the imager assembly. The associated connector 912 on the adapter member 912 is adjusted accordingly to mate with the imager assembly connector 914 in accordance with its position on the imager assembly 908. For example, when the imager assembly connector 914 is provided on the top of the imager assembly 908, the connector 912 on the adapter is facing down (perpendicular to the film path) to mate with the imager assembly connector 914.

Figure 10:
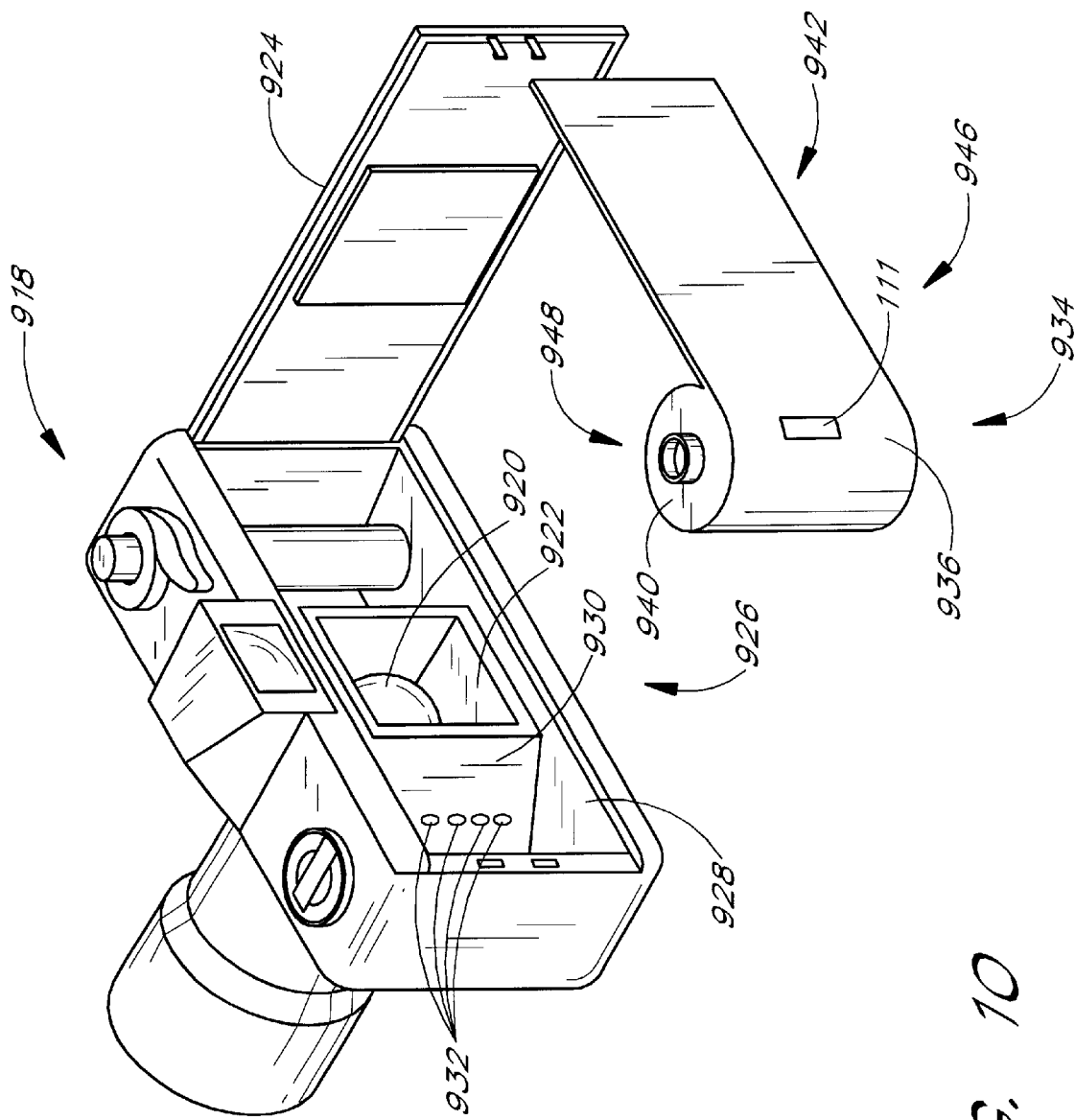
FIG. 10 illustrates another camera and an e-film cartridge constructed in accordance with a modification of the e-film cartridge illustrated in FIG. 1.

FIGS. 10 and 11 illustrate a modification of the e-film cartridge 107 illustrated in FIG. 1. As shown in FIG. 10, a conventional 35 mm camera 918 includes a lens 920 and an aperture 922 defining an optical path of the camera 918. The camera 918 also includes a back 924 hingedly connected to the body of the camera 918 so as to open and close the film compartment 926 of the camera 918. The camera 918 can be constructed in accordance with a conventional 35 mm camera, such as the camera 102 illustrated in FIG. 1. However, the film compartment 926 of the camera 918 has been illustrated in more detail.

In particular, the film compartment 926 includes a film can area 928 which has a curved inner wall 930, as is conventional in the art. The curved inner wall 930 of the film can area 928 includes a plurality of sensors 932.

As is known in the art, the sensors 932 typically are used for detecting or reading a code printed on a conventional 35 mm film cartridge. Typically, the sensors 932 are configured to read what is commonly referred to as "DX coding" which is commonly printed on an outer surface of a conventional 35 mm film cartridge according to standard practices of the industry, discussed below in more detail with reference to FIGS. 12–18.

Additionally, one or all of the sensors 932 can be used by the camera 918 to detect the presence of film within the film can area 928. For example, one of the sensors 932 can be in the form of a button that is configured to make a contact and be depressed by a film cartridge disposed in a film can area 928 or an electrical contact that senses the film cartridge using the DX coding metalic pads as conductive plates. This type of sensor can be independent of the other sensors 932. Alternatively, a plurality of the sensors 932 can be mounted on a movable mounting platform (not shown) the entirety of which is depressed when a film cartridge is disposed in the film can area 928. In this construction, when a film cartridge is disposed in the film can area 928, the sensors 932 make a contact with the DX coding provided on the outer surface of the film cartridge and all the sensors, being mounted to a platform, are depressed into the inner wall 930, thus triggering the film-presence sensor.

As noted above, it has been found that the shutters and other mechanisms of a conventional 35 mm camera, such as the camera 918, function sufficiently when there is no film cartridge disposed in the film can area 928, i.e., a film-presence sensor is not triggered. Additionally, it has been found that certain other operations of the camera can be circumvented, thus allowing an electronic film cartridge to be used with a conventional 35 mm camera 918 more conveniently.

Thus, in accordance with one embodiment of the present invention, an e-film cartridge 934 includes a housing 936 which defines an outer contour 938 that is configured such that the housing does not completely depress at least one of the sensors 932 when the housing 936 is disposed in the film compartment 926.

Figure 11A:
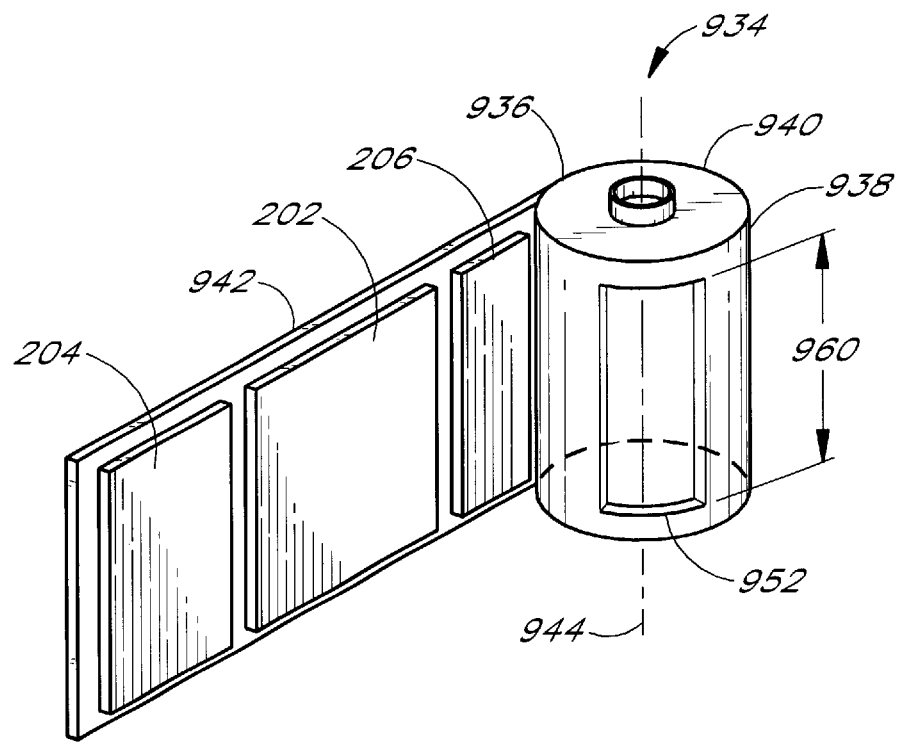
FIG. 11A is a top, front, and left side perspective view of a modification of the e-film cartridge illustrated in FIG. 2A.

In the illustrated embodiment, the housing 936 of the e-film cartridge 934 defines a can portion 940 and an extension 942 extending from the can portion 940. As shown in FIG. 11A, the can portion 940 is generally cylindrical in shape and the extension portion 942 is generally rectangular. The can portion 940 and the extension portion 942 can be construed in accordance with the description of the e-film cartridge 107 set forth above with reference to FIG. 2A, except as noted below. Thus, the remaining portions of the e-film cartridge 934 that are identical to the corresponding components of the e-film cartridge 107 are identified with identical reference numerals.

As shown in FIG. 11A, the outer contour 938 of the can portion 940 is generally cylindrical shape and extends around a longitudinal axis 944. However, it is to be noted that the outer contour 938 of the can portion 940 could have any shape, such as, for example, but without limitation, a separate rectangular electronics housing and a cylindrical battery compartment, such as the electronics housing 308 in the battery compartment 310 illustrated in FIG. 3A, a wedge-shaped electronics housing and a cylindrical-shaped battery compartment such as the electronics housing 406 and battery compartment 410 illustrated in FIG. 4A, and partially cylindrical and partially rectangular can members 606, 706, and 904 illustrated in FIGS. 6A, 7 and 9A, discussed in more detail below.

Figure 11B:
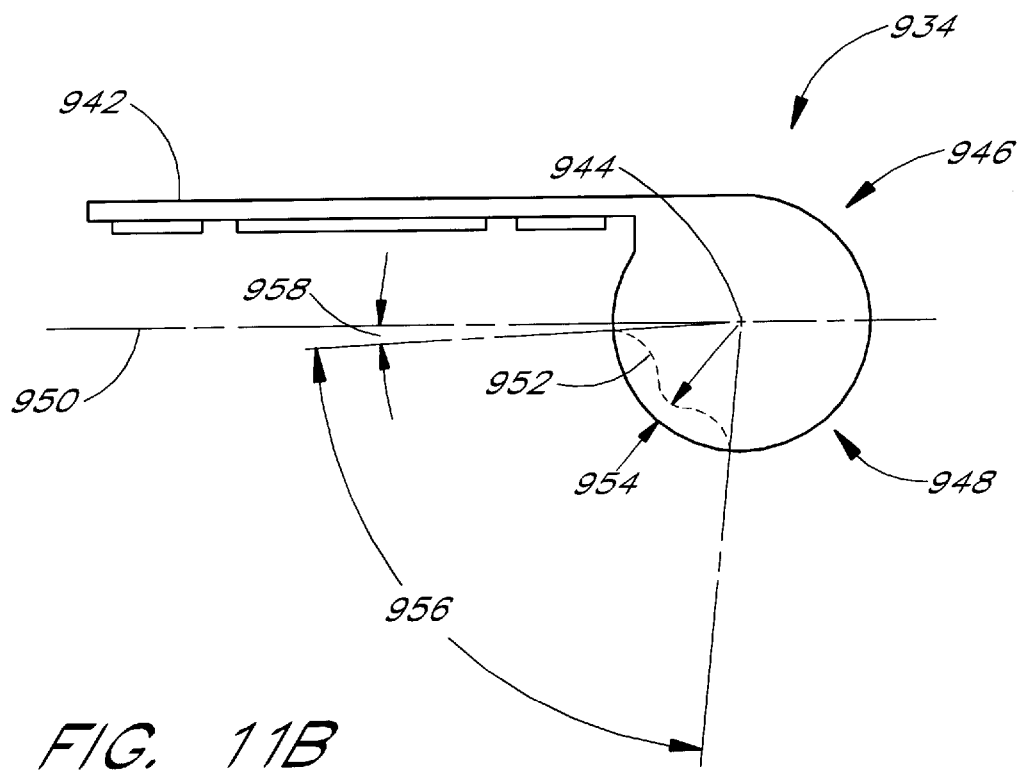
FIG. 11B is a top plan view of the e-film cartridge shown in FIG. 11A.

With reference to FIG. 11B, the housing 934 includes an outer portion 946 and an inner portion 948 disposed on opposite sides of a plane 950 which extends through the axis 944 and approximately parallel to the back portion 942 of the housing 934. As shown in FIGS. 11B, the outer and inner portions 946, 948 are defined as being on opposite sides of the plane 950.

As used throughout this disclosure, terms of relative orientation in positions such as "horizontal," "vertical," "above," "below," "upper," "lower," "inner," and "outer" depend on the chosen orientation of the electronic film cartridge 934 and are used here to simplify the description. These relative terms of orientation and position are used in the context of the illustrated embodiment, however, because other orientations are possible, the present invention should not be limited to the illustrated orientation. Thus, these terms of orientation and position are used herein solely for the purposes of illustration as those skilled in the art will appreciate that certain features of the electronic film cartridge 934 of the present embodiment, as well as those described above and below, are not orientation-sensitive, and that other orientations are possible.

With reference to FIGS. 11A and 11B, in the illustrated embodiment, the outer contour 938 includes a recess 952 disposed at least partially on the inner side 948 of the cartridge 934. The recess 952 is sized and positioned such that the housing 934 does not completely depress a film presence sensor mounted to the camera 918.

As noted above, a film presence sensor in the camera 918 may comprise one sensor mounted to the interior of the film compartment 926 such as one of the sensors 932 or may comprise any number of the sensors 932 mounted to a movable substrate. Thus, the recess 952 may be sized such that only one of the sensors 932 is not completely depressed when the film cartridge 934 is disposed in the film compartment 926. In one embodiment, the recess 952 is sized and positioned such that none of the sensors 932 are contacted by the e-film cartridge 934 when the cartridge 934 is disposed in the film compartment 926.

With reference to FIG. 11B, the recess 952 has a depth 954 of at least about 2 mm. However, the depth 954 of the recess 952 can vary depending on the design of the corresponding 35 mm camera 918.

With reference to FIG. 11B, depending on the particular sensors 932 that are to be aligned with the recess 952, the recess 952 extends through an angle 956 around the longitudinal axis 944 of the cylindrical outer counter 938. In the illustrated embodiment, the angle 956 is approximately 57°. In this embodiment, the recess 952 is offset from the plane 950 by an angle 958 that is approximately 0.35°. With reference to FIG. 11A, the recess 952 extends over a height 960 that is approximately 36 mm.

It will be understood that the above-noted dimensions are merely exemplary. The dimensions each depend upon one another, upon the particular sensors which are to be aligned with the recess 952, and, optionally, upon other factors. It is understood that one of skill in the art can readily vary the dimensions to adapt the e-film cartridge 934 for a particular application through routine experimentation, in view of the disclosure herein.

Alternatively, as noted above, the outer contour 938 can be defined by other housing constructions and retain the ability to avoid triggering at least one sensor 932 present in the film compartment 926. For example, the outer contour 938 of the can portion 940 include a separate rectangular electronics housing and a cylindrical battery compartment, such as the electronics housing 308 in the battery compartment 310 illustrated in FIG. 3A. With this construction, the rectangular electronics housing and the battery compartment can be attached such that the outer contour defined by the outer surfaces of the components do not completely depress at least one sensor in the film compartment 926 of the camera 918.

In another modification, the present e-film cartridge can include a wedge-shaped electronics housing and a cylindrical-shaped battery compartment such as the electronics housing 406 and battery compartment 410 illustrated in FIG. 4A. In this modification, the wedge-shaped electronic housing can be connected to the battery compartment in a particular orientation such that the outer contour defined by the outer surfaces of these components does not completely depress at least one sensor 932 of the camera 918. Alternatively, the e-film cartridge can include a partially cylindrical and partially rectangular can member, such as the can members 606, 706, and 904 illustrated in FIG. 6A, 7 and 9A. In these modifications, the can members can include a recess, such as the recess 952.

As noted above, commercially available film cartridges for conventional 35 mm cameras typically include coding or indicia on an outer surface thereof that can be read by sensors provided in the film compartment of a 35 mm camera, such as the sensors 932 illustrated in FIG. 10. An example of a conventional 35 mm film cartridge is illustrated in FIGS. 12–17.

As shown in FIGS. 12–17, a film cartridge 970 is formed of an outer shell 972 defining a cylindrical portion 974 closed by end caps 976, 978. A reel 980 extends through the cylindrical portion 974 and is rotatably supported by the end caps 976, 978. Thirty-five millimeter film 982 is wound around the reel 980 and is fed through a camera.

The reel 980 also includes a projecting post 984 for engaging a rewind mechanism (not shown) provided on the camera 918.

With reference to FIG. 17, the film cartridge 970 includes a coding area 986 disposed on the cylindrical portion 974. With reference to FIG. 18, the coding area 986 defines a number of individual sensing areas 988, 990, 992, 994, 996, 998, 1000, 1002, 1004, 1006, 1008, 1010. The sensing areas 992, 996, 1002, 1006, 1010 appear as black in FIG. 18, and sensing areas 988, 990, 994, 998, 1000, 1004 and 1008 are illustrated as being white. The various arrangements of the sensing areas being black or white can be used to indicate film speed, number of exposures on the film contained within the cartridge 970, and the exposure latitude or the dynamic range of the film, as known in the art.

In order to provide uniformity for the positioning of sensing areas such as sensing area 986, standards have been developed for placement of the sensing areas and as well as for sensors provided on cameras such as the sensors 932. For example, the American National Standards Institute (ANSI) and the International Standards Organization (ISO) have published standards for use in providing sensing areas on film cartridges and as well as for guidance in manufacturing cameras in the positioning of sensors therein. In particular, ANSI has published Document No. ANSI/NAPMIT1.14 -1997 which provides information regarding the standards of DX coding for film and the positioning of DX sensors for 35 mm cameras. See, id. at pp. 30–33.

As disclosed in the ANSI/NAPM IT1.14–1997 document, the sensing areas should be arranged in two rows, 1012, 1014 (FIG. 15) such that a center of the row 1012 is offset from a plane 1016 which bisects the cartridge 970 and is parallel to the film path, by an angle 1018 that is approximately 78.3°. Additionally, the second row 1014 should be offset from the plane 1016 by an angle 1020 which is approximately 44.4°. Additionally, it is disclosed that the sensors should be positioned within a range 1022 of approximately ±11.35°.

With reference to FIG. 16, it is also disclosed that the sensors should be arranged so as to be spaced along the height of the cartridge 970 to have a nominal spacing 1024 of approximately 5.51 mm.

With reference to FIG. 15, it is also disclosed that the sensors should be confined corresponding to an area having a nominal length 1026 of approximately 3.12 mm. Thus, in light of the published standards regarding the arrangement and sizing of DX coding areas on film cartridges and the preferred locations of sensors for a 35 mm camera, one of ordinary skill in the art can readily vary the size of the recess (FIGS. 11A and 11B) in order to align the recess 952 with a particular sensor 932 (FIG. 10), a group of sensors 932 or several different groups of sensors 932, while intentionally causing contact with other sensors 932.

Although the invention has been described in terms of certain preferred embodiments, other embodiments that are apparent to those of ordinary skill in the art, including embodiments which do not provide all of the features and advantages set forth herein, are also within the scope of this invention. Accordingly, the scope of the invention is intended to be defined by the claims that follow.

What is claimed is:

1. An electronic film cartridge comprising:
   a housing portion adapted to fit within a film compartment of a photographic camera, the housing defining an outer contour; and
   a recess defined in the outer contour, the recess being shaped such that the outer contour does not contact any DX coding or film-presence sensors mounted in the film compartment when the housing is disposed in the film compartment.

2. The electronic film cartridge of claim 1, wherein the recess extends at least 56° around the outer contour of the housing.

3. The electronic film cartridge of claim 1, wherein the recess is at least 2 mm deep.

4. An electronic film cartridge comprising:
   a housing portion adapted to fit within a film compartment of a photographic camera, the housing defining an outer contour;
   the outer contour of the housing being shaped such that the housing does not completely depress at least one sensor mounted in the film compartment when the housing is disposed in the film compartment.

5. The electronic film cartridge of claim 4, wherein the outer contour of the housing comprises an outer surface that is at least partially curved complementarily to an inner surface of a film compartment of a photographic camera.

6. The electronic film cartridge of claim 4, wherein the outer contour is configured such that the housing does not completely depress any film speed coding sensors mounted within the film compartment.

7. The electronic film cartridge of claim 4, wherein the outer contour defines a recess extending approximately 50° around the housing.

8. The electronic film cartridge of claim 7, wherein the recess extends approximately 56° around the outer surface.

9. The electronic film cartridge of claim 7, wherein the recess extends approximately 56.6° around the outer surface.

10. The electronic film cartridge of claim 4, wherein the contour defines a recess extending at least about 3 mm along the outer surface.

11. The electronic film cartridge of claim 10, wherein the recess extends at least about 3.12 mm along the outer surface.

12. An electronic film cartridge comprising:
    a housing portion adapted to fit within a film compartment of a photographic camera having sensors configured to contact a film cartridge housing disposed within the film compartment; and
    means for preventing the housing from making operative contact with at least one of the sensors when the housing is disposed within the film compartment.

13. The electronic film cartridge of claim 12, wherein the sensors are DX coding sensors, the means for preventing comprising means for preventing the housing from contacting any of the DX coding sensors.

14. An electronic film cartridge, comprising:
    a can section containing electronic devices and having an outer contour; and
    an imager assembly coupled to the can section by a flexible conductor, said conductor allowing for a variation of the distance between the imager assembly and the can section, the flexible conductor electrically coupling the imager assembly to said electric devices;
    the outer contour being configured such that the outer contour does not completely depress at least one sensor protruding into a film compartment of a photographic camera when the can section is disposed in the film compartment.

15. The electronic film cartridge of claim 14, wherein the outer contour defines a recess extending approximately 50° around the housing.

16. The electronic film cartridge of claim 15, wherein the recess is about 2 mm deep.

17. An electronic film cartridge, comprising:

a can section having an outer contour and an extension member configured to extend along a film path of a conventional 35 mm film photographic camera when the can section is inside a film can area of said camera, the extension member comprising an edge connector to conduct electrical signals; and an imager assembly, the imager assembly, the imager assembly comprising a resilient connector adapted to couple to said edge connector, the resilient connector mating with said edge connector at varying distances along said extension member;

the outer contour being configured such that the can section does not completely depress at least one sensor protruding into the film can area of the film photographic camera when the can section is disposed in the film can area.

18. The electronic film cartridge of claim 17, wherein the outer contour of the housing comprises an outer surface that is at least partially curved complementarily to an inner surface of a film compartment of a photographic camera.

19. The electronic film cartridge of claim 17, wherein the outer contour is configured such that the housing does not completely depress any film speed coding sensors mounted within the film compartment.

20. The electronic film cartridge of claim 17, wherein the outer contour defines a recess extending approximately 50° around the housing.

21. A method for manufacturing an electronic film cartridge, comprising:

forming a housing portion with an outer contour corresponding to a shape of a film compartment of a photographic camera;

forming a recess on the outer contour of the housing;

positioning the recess on the outer contour such that the outer contour is aligned with DX coding sensors and a film presence sensor mounted in the film compartment of the photographic camera; and shaping the recess such that outer contour does not contact the DX coding or film presence sensors when the housing is disposed in the film compartment.

22. The method according to claim 21, wherein the step of shaping comprises sizing the recess such that the recess extends about 56° around the outer contour of the housing.

23. The method according to claim 21, wherein the step of sizing comprises providing the recess with a depth of at least 2 mm.

24. A method for manufacturing an electronic film cartridge, comprising:

forming a housing portion with an outer contour shaped to fit within a film compartment of a photographic camera; and shaping the outer contour such that outer contour does not completely depress at least one sensor mounted in the film compartment.

25. The method according to claim 24, wherein the step of shaping comprises sizing the recess such that the recess extends about 50° around the outer contour of the housing.

26. The method according to claim 24, wherein the step of sizing comprises providing the recess with a depth of about 2 mm.

* * * * *